(12) United States Patent
Kudo et al.

(10) Patent No.: US 10,303,051 B2
(45) Date of Patent: May 28, 2019

(54) HYPERBRANCHED POLYMER, PROCESS FOR PRODUCING SAME, AND COMPOSITION

(71) Applicants: THE SCHOOL CORPORATION KANSAI UNIVERSITY, Suita-shi, Osaka (JP); DAICEL CORPORATION, Osaka-shi, Osaka (JP)

(72) Inventors: Hiroto Kudo, Suita (JP); Ichiro Takase, Himeji (JP)

(73) Assignees: THE SCHOOL CORPORATION KANSAI UNIVERSITY, Suita-Shi, Osaka (JP); DAICEL CORPORATION, Osaka-Shi, Osaka (JP)

( * ) Notice: Subject to any disclaimer, the term of this patent is extended or adjusted under 35 U.S.C. 154(b) by 0 days.

(21) Appl. No.: 15/507,918

(22) PCT Filed: Jul. 31, 2015

(86) PCT No.: PCT/JP2015/071833
§ 371 (c)(1),
(2) Date: Mar. 1, 2017

(87) PCT Pub. No.: WO2016/035491
PCT Pub. Date: Mar. 10, 2016

(65) Prior Publication Data
US 2017/0283560 A1    Oct. 5, 2017

(30) Foreign Application Priority Data

Sep. 2, 2014 (JP) ................. 2014-178532
Jun. 22, 2015 (JP) ................. 2015-124535

(51) Int. Cl.
*G03F 7/004* (2006.01)
*H01L 21/027* (2006.01)
(Continued)

(52) U.S. Cl.
CPC .......... *G03F 7/0045* (2013.01); *C08G 61/02* (2013.01); *C08G 65/34* (2013.01); *C08G 83/005* (2013.01);
(Continued)

(58) Field of Classification Search
CPC ........ G03F 7/004; G03F 7/0045; G03F 7/038; G03F 7/039; G03F 7/16; G03F 7/20; G03F 7/26; C08G 61/02; C08G 83/005
(Continued)

(56) References Cited

U.S. PATENT DOCUMENTS

2002/0042017 A1    4/2002  Hatakeyama
2008/0213544 A1*   9/2008  Devadoss ................ C09D 5/34
                                                    428/173
(Continued)

FOREIGN PATENT DOCUMENTS

EP    2 599 814 A1    6/2013
JP    2002-99090 A    4/2002
(Continued)

OTHER PUBLICATIONS

International Search Report, issued in PCT/JP2015/071833, dated Oct. 27, 2015.
(Continued)

*Primary Examiner* — Amanda C. Walke
(74) *Attorney, Agent, or Firm* — Birch, Stewart, Kolasch & Birch, LLP

(57) ABSTRACT

Provided is a hyperbranched polymer having such a backbone that is readily decomposable by an acid. The hyper-
(Continued)

branched polymer is derived from, via reaction, monomers including a monomer (X) and a monomer (Y). The monomer (X) contains three or more hydroxy groups per molecule. The monomer (Y) contains two or more groups represented by General Formula (y) per molecule. The monomer (X) includes at least one compound selected from the group consisting of cyclodextrins, compounds represented by General Formula (I), pillararenes, compounds represented by General Formula (II), compounds represented by General Formula (III), and compounds represented by General Formula (IV). The monomer (Y) includes a compound represented by General Formula (1). General Formulae (y), (I), (II), (III), (IV), and (1) are expressed as follows:

[Chem. 1]

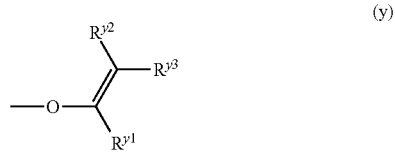

(y)

[Chem. 2]

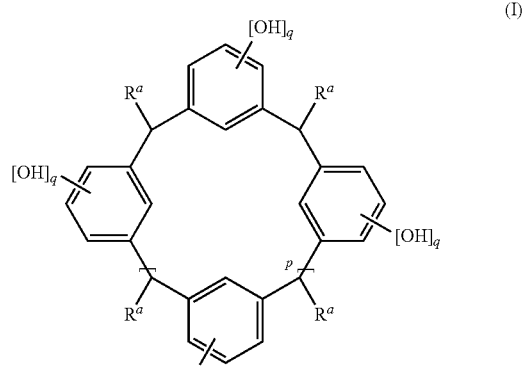

(I)

[Chem. 3]

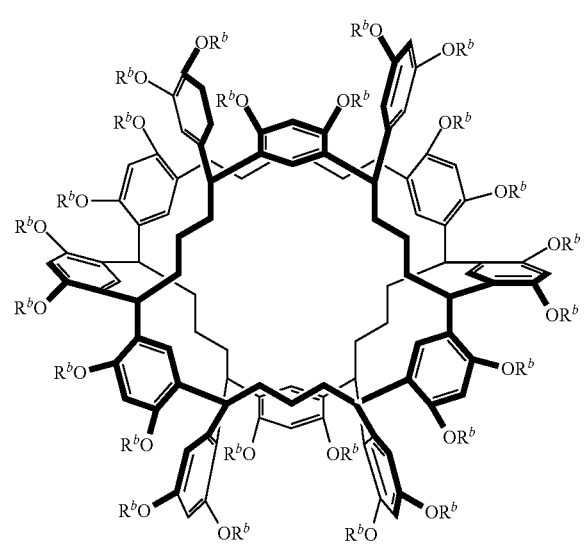

(II)

[Chem. 4]

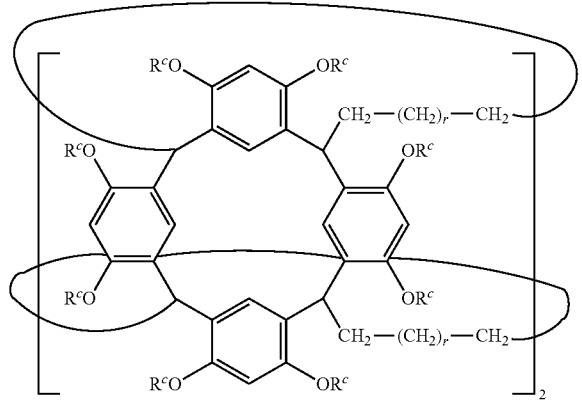

(III)

[Chem. 5]

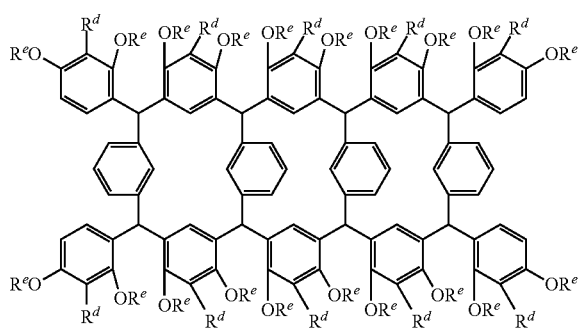

(IV)

[Chem. 6]

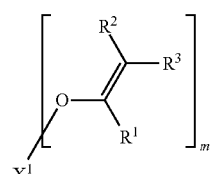

(1)

19 Claims, 11 Drawing Sheets

(51) Int. Cl.
    *C08G 65/34*     (2006.01)
    *C08G 61/02*     (2006.01)
    *C08G 83/00*     (2006.01)
    *G03F 7/038*     (2006.01)
    *G03F 7/039*     (2006.01)
    *G03F 7/16*     (2006.01)
    *G03F 7/20*     (2006.01)
    *G03F 7/26*     (2006.01)
(52) U.S. Cl.
    CPC .............. *G03F 7/038* (2013.01); *G03F 7/039* (2013.01); *G03F 7/16* (2013.01); *G03F 7/20* (2013.01); *G03F 7/26* (2013.01); *H01L 21/0274* (2013.01); *C08G 2261/312* (2013.01); *C08G 2261/3342* (2013.01); *C08G 2261/364* (2013.01)

(58) Field of Classification Search
USPC .................. 410/270.1, 322, 325, 330, 331
See application file for complete search history.

(56) References Cited

U.S. PATENT DOCUMENTS

| | | | |
|---|---|---|---|
| 2009/0312490 A1 | 12/2009 | Ito et al. | |
| 2013/0081999 A1* | 4/2013 | Whiteford | C07D 498/18 210/650 |
| 2015/0266986 A1* | 9/2015 | Wang | A61L 15/60 424/618 |

FOREIGN PATENT DOCUMENTS

| | | |
|---|---|---|
| JP | 2003-257236 A | 9/2003 |
| JP | 2007-241121 A | 9/2007 |
| JP | 2010-275299 A | 12/2010 |
| JP | 2011-219752 A | 11/2011 |
| JP | 2011-231074 A | 11/2011 |
| JP | 2013-205508 A | 10/2013 |
| JP | 2014-221874 A | 11/2014 |
| WO | WO 2005/080469 A1 | 9/2005 |

OTHER PUBLICATIONS

Kudo et al., "Synthesis of Hyperbranched Polyacetals via $A_n+B_2$-Type Polyaddition (n=3, 8, 18, and 21): Candidate Resists for Extreme Ultraviolet Lithography", Journal of Polymer Science, Part A: Polymer Chemistry, May 19, 2015, vol. 53, Issue 20, pp. 2343-2350.

Written Opinion of the International Searching Authority, issued in PCT/JP2015/071833, dated Oct. 27, 2015.

Kudo et al., "Extreme Ultraviolet (EUV)-Resist Materials of Noria (Water Wheel-Like Cyclic Oligomer) Derivatives containing Acetal Moieties," Journal of Photopolymer Science and Technology (2010), vol. 23, No. 5, pp. 657-664.

Kudo et al., "Synthesis and Resist Properties of Hyperbranched Polyacetals,"Journal of Photopolymer Science and Technology (2015), vol. 28, No. 1, pp. 125-129.

* cited by examiner

[Fig. 1]
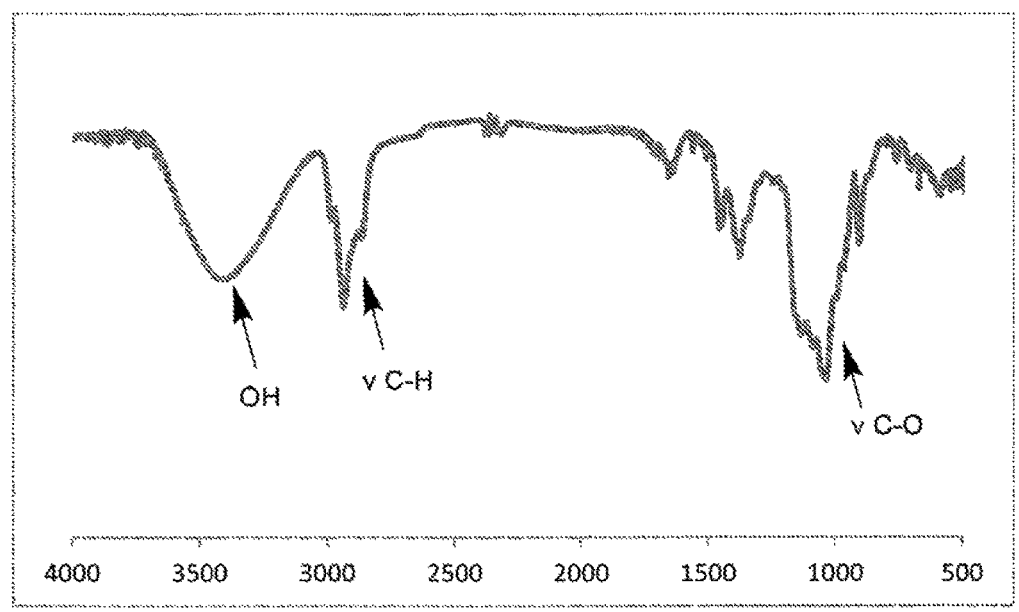

[Fig. 2]
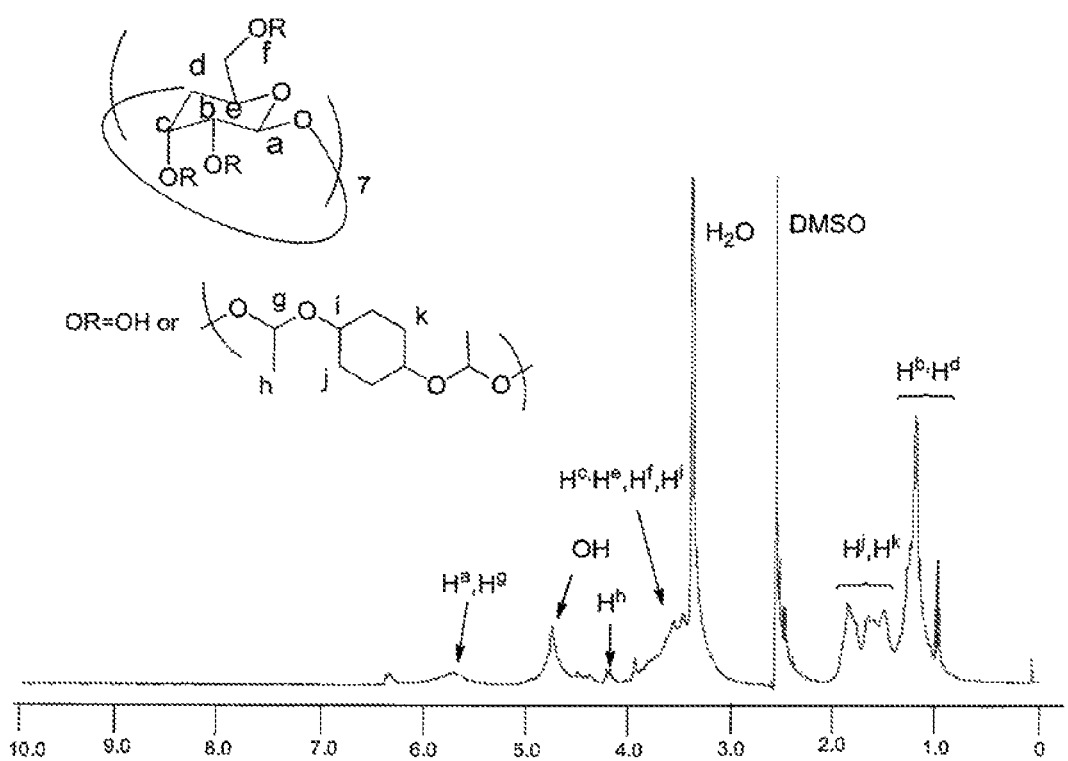

[Fig. 3]
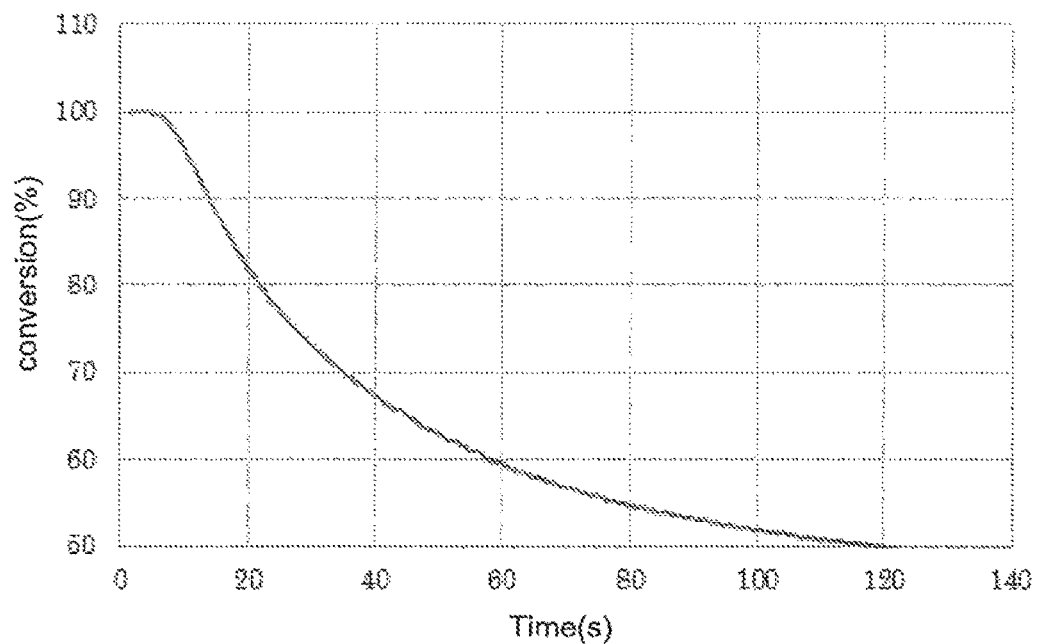
[Fig. 4]
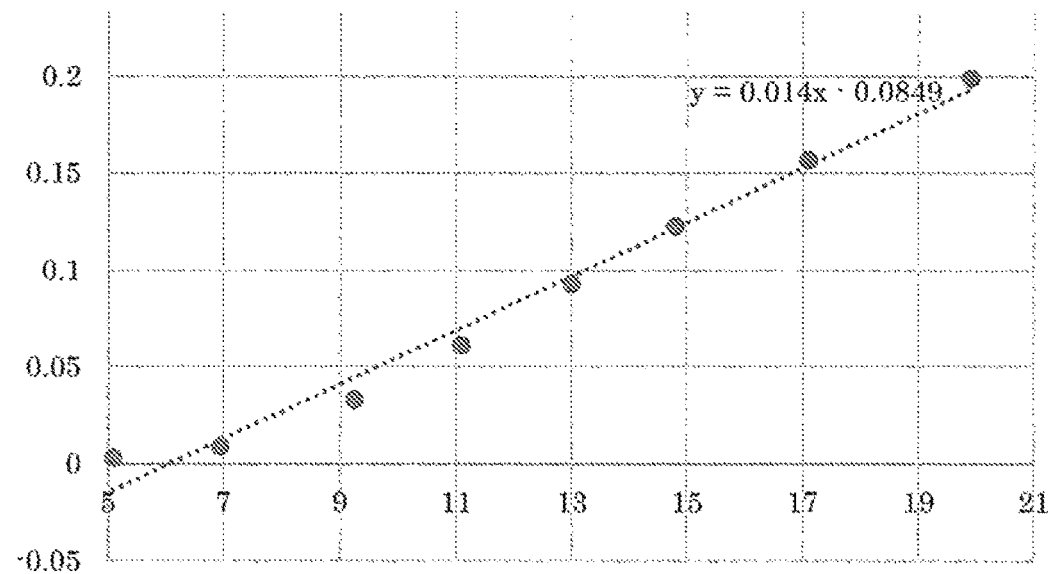

[Fig. 5]
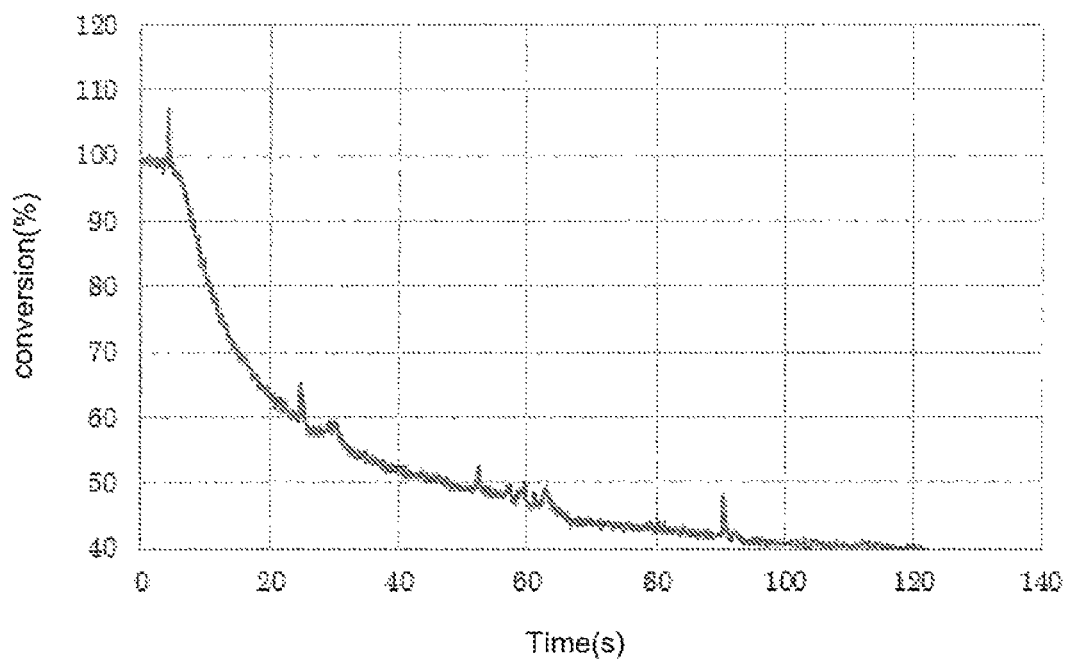
[Fig. 6]
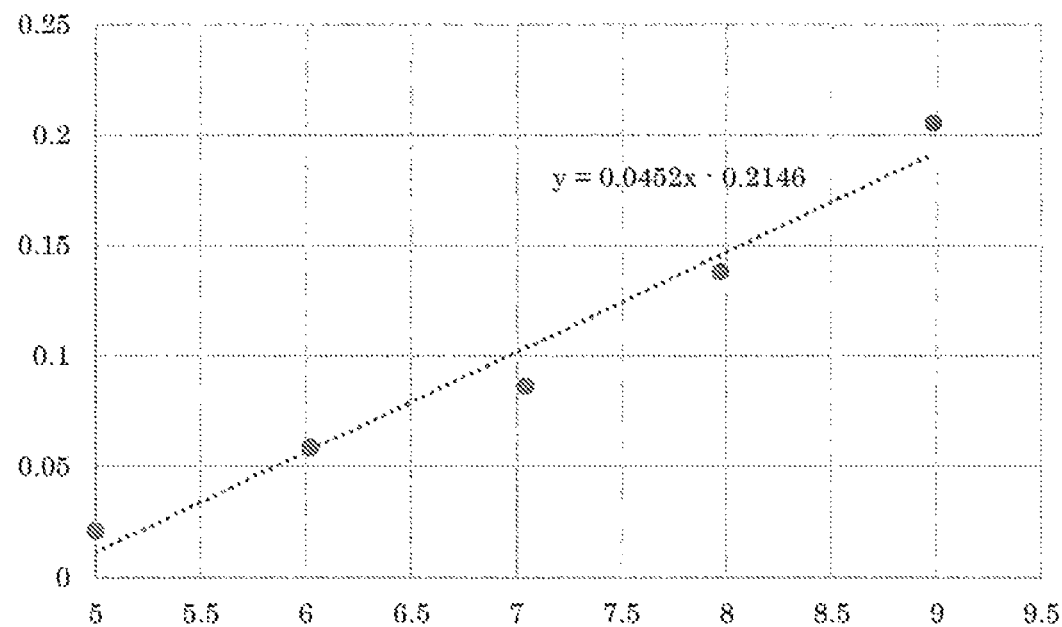

[Fig. 7]
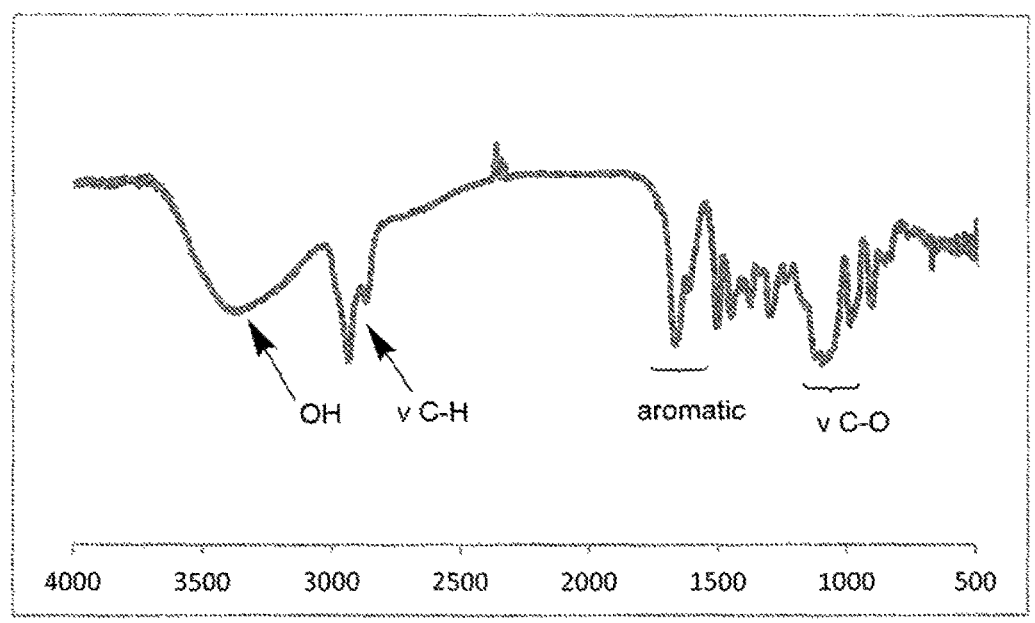

[Fig. 8]
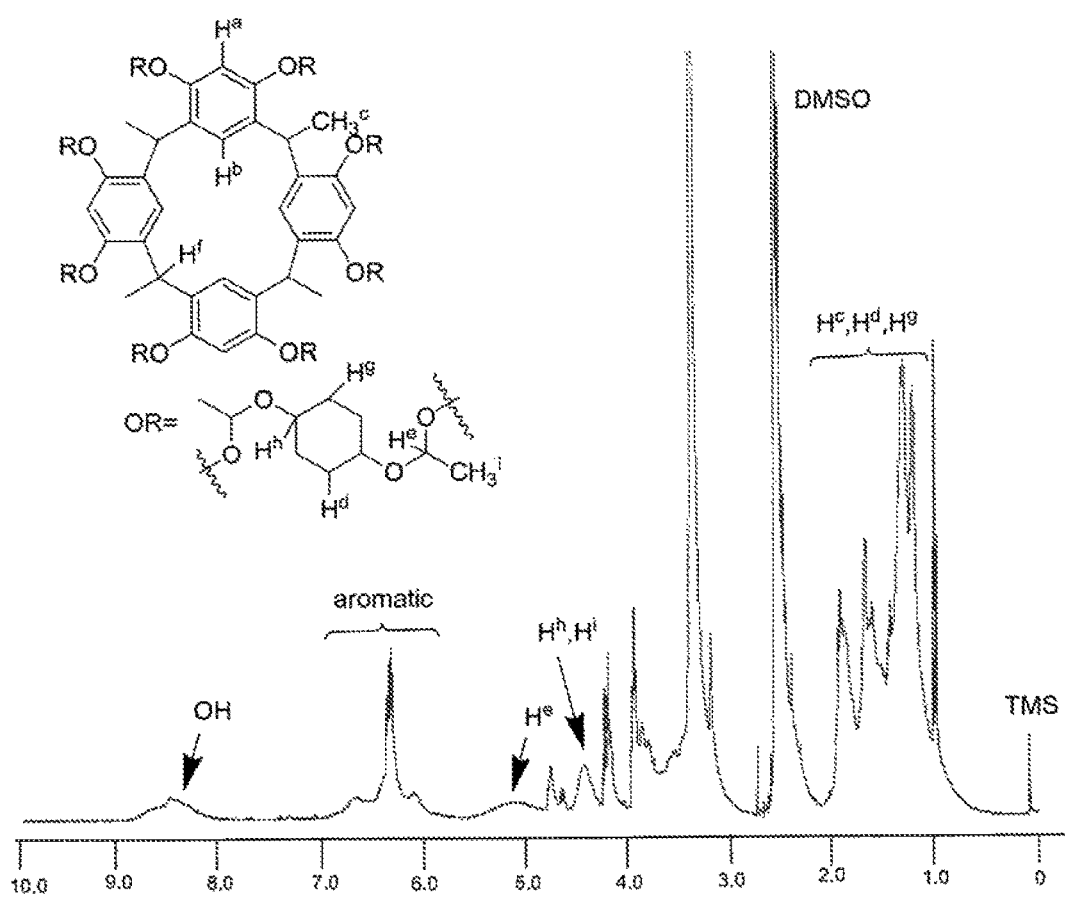

[Fig. 9]
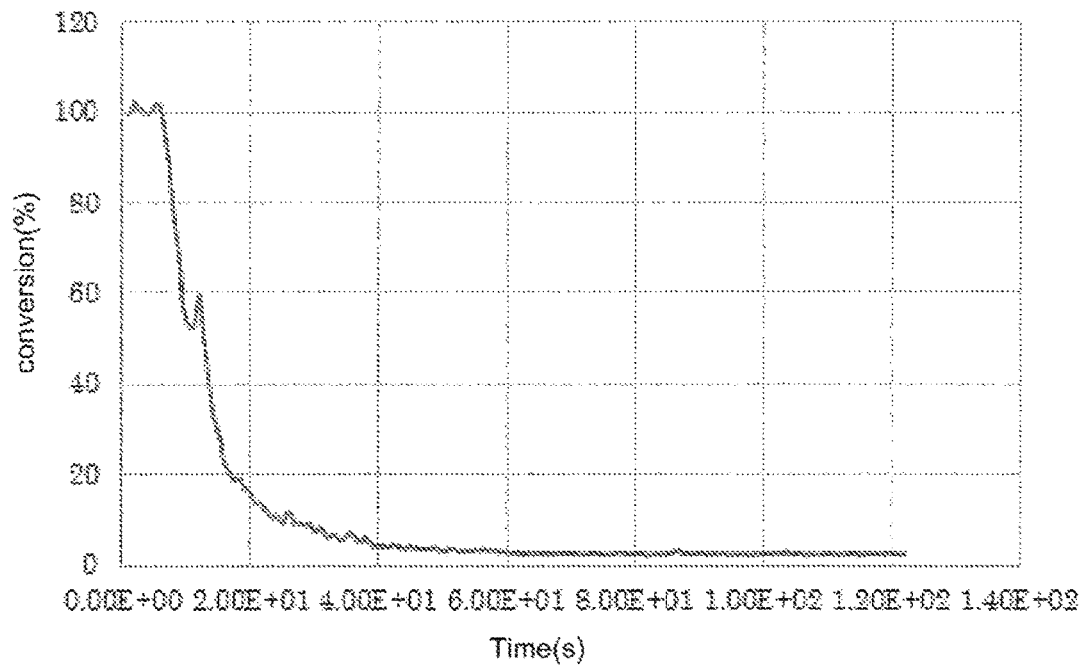
[Fig. 10]
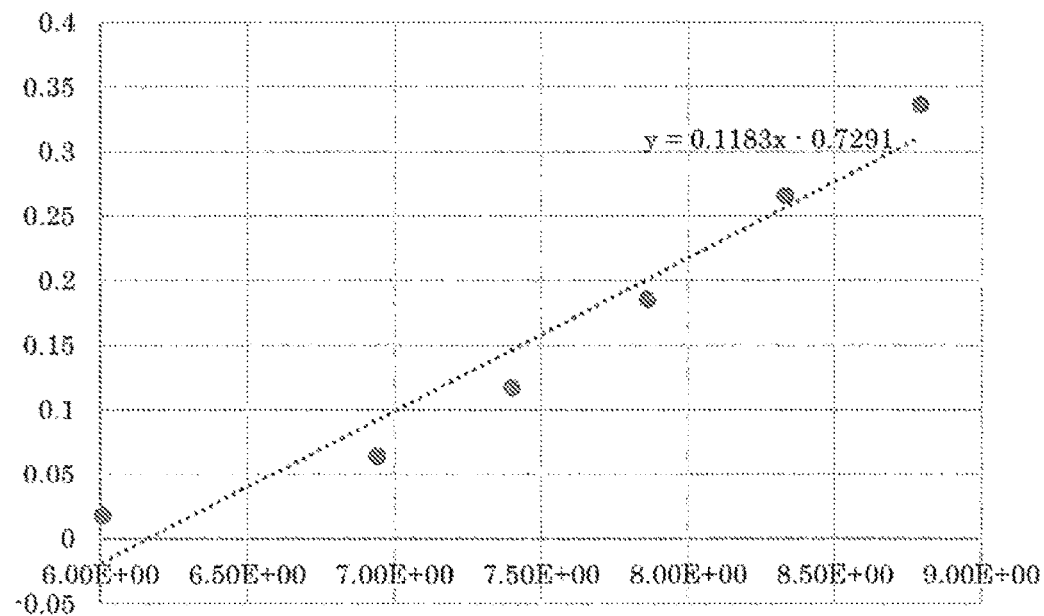

[Fig. 11]
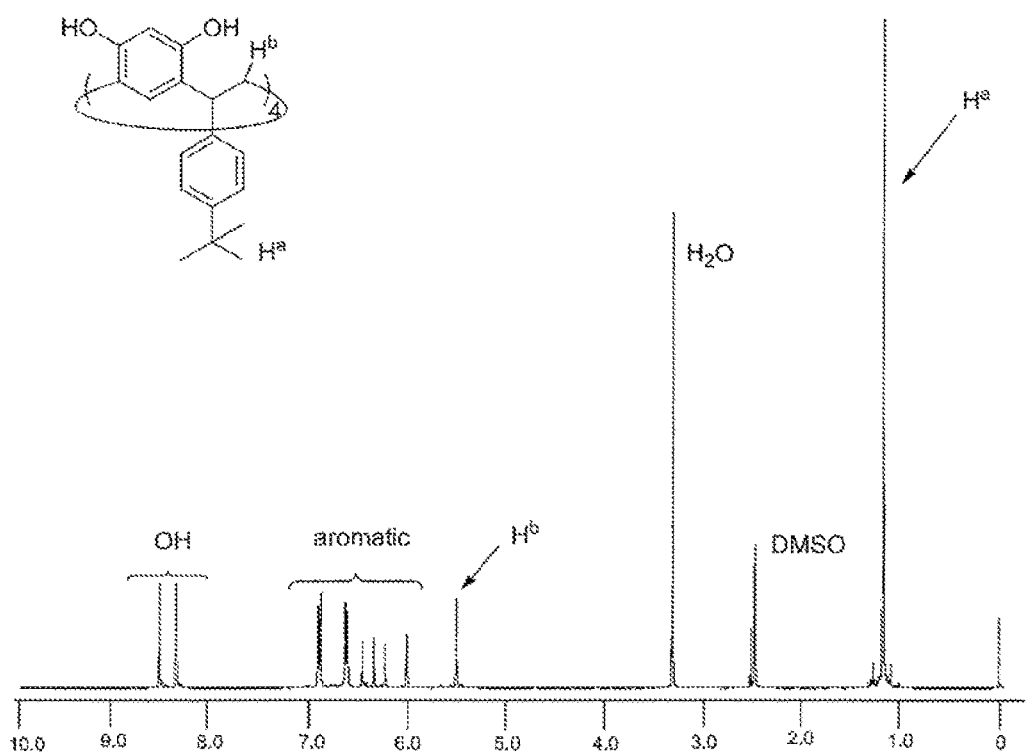

[Fig. 12]
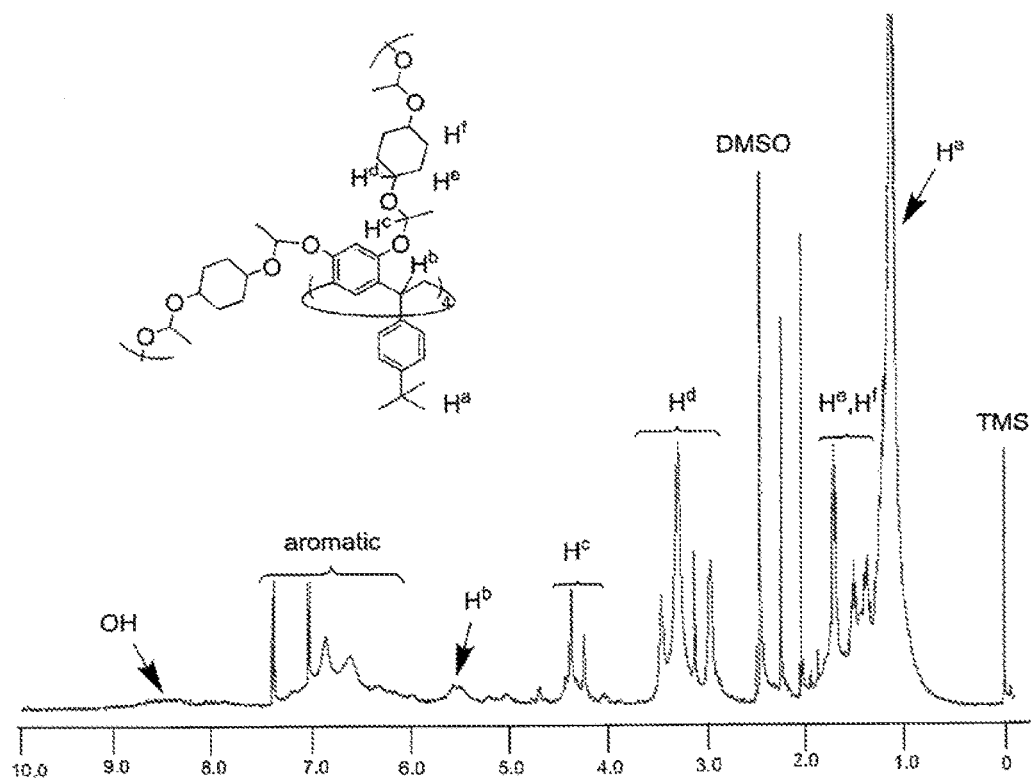

[Fig. 13]
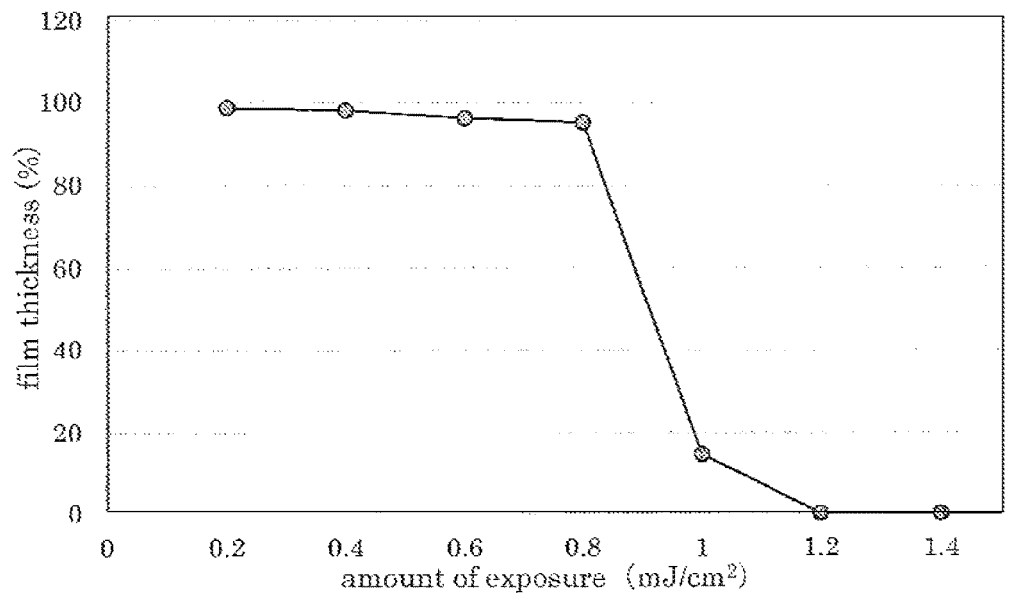
[Fig. 14]
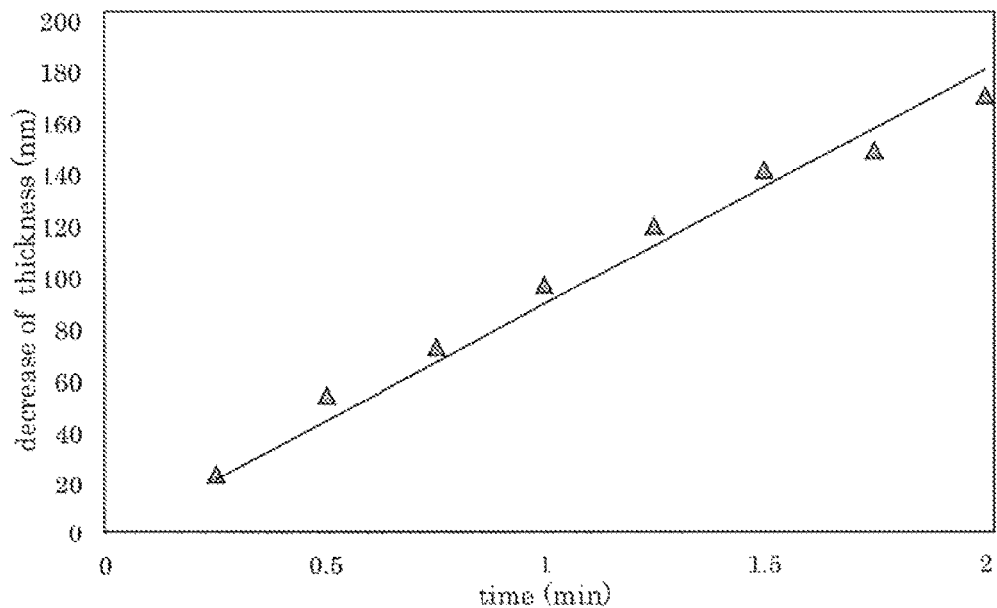

[Fig. 15]
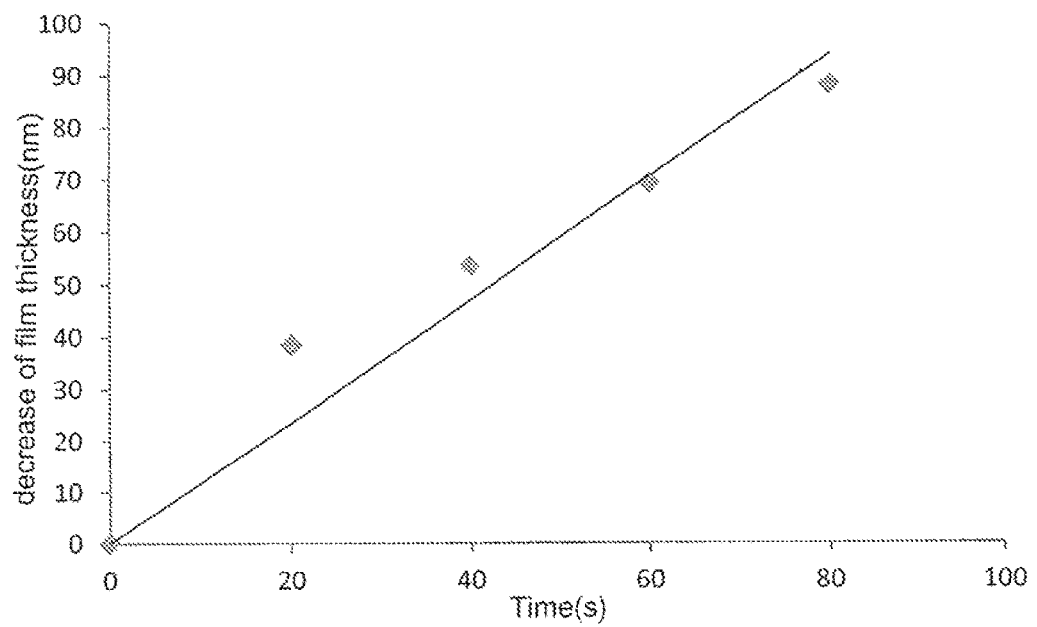

HYPERBRANCHED POLYMER, PROCESS FOR PRODUCING SAME, AND COMPOSITION

TECHNICAL FIELD

The present invention relates to a hyperbranched polymer and a method (process) for producing the hyperbranched polymer, where the hyperbranched polymer is useful particularly as resist materials; and to a composition containing the hyperbranched polymer. This application claims priority to Japanese Patent Application No. 2014-178532, filed Sep. 2, 2014 to Japan; and to Japanese Patent Application No. 2015-124535, filed Jun. 22, 2015 to Japan, the entire contents of each of which applications are incorporated herein by reference.

BACKGROUND ART

Large-scale integrated circuits (LSIs) have higher and higher integration densities and are produced at higher and higher speeds in the field of photolithography, which is a fine patterning (microfabrication) technology. Accordingly, resist materials that can provide for the higher integration and higher speed production have been intensively developed. Such resist materials recently mainly require nano-level control of surface smoothness after development and good sensitivity even upon the use of low-power light sources. Resist materials having both of these properties are excellent in resolution, line width roughness (LWR), and sensitivity and are possibly usable typically as resist materials that are used for extreme-ultraviolet radiation (EUV) and enable extremely highly fine patterning.

Exemplary proposed resist materials are resins each including a polymer backbone having carboxy or phenolic hydroxy in side chains, and containing an acid-degradable substituent introduced into the polymer backbone (see Patent Literature (PTL) 1 and PTL 2). The resin disclosed in PTL 1 employs a t-butyl ester group as the acid-degradable substituent. In contrast, the resin disclosed in PTL 2 employs an acetal group as the acid-degradable substituent.

CITATION LIST

Patent Literature

PTL 1: Japanese Unexamined Patent Application Publication (JP-A) No. 2007-241121
PTL 2: JP-A No. 2002-99090

SUMMARY OF INVENTION

Technical Problem

The resins (resins containing acid-degradable substituents in side chains) disclosed in PTL 1 and PTL 2 are used as resist materials in the form of compositions with acid generators. Specifically, light and/or heat is applied to the resist materials to generate acids, the acids decompose the acid-degradable substituents, and this allows the resist materials to offer solubility in developers. These resist materials, however, offer insufficient surface smoothness after development, because their polymer backbones remain even after the decomposition by the application of light and/or heat. In addition, the resist materials have insufficient sensitivity, because the three-dimensional structures of the polymer backbones impede the completion of the decomposition.

Accordingly, the present invention has an object to provide a hyperbranched polymer and a method for producing the same, where the hyperbranched polymer has a backbone that is readily decomposable by an acid.

The present invention has another object to provide a composition that has resolution, LWR, and sensitivity at excellent levels when serving as a resist material.

Solution to Problem

After intensive investigations to achieve the objects, the inventors of the present invention found that a hyperbranched polymer derived from a reaction of specific monomers in combination has a backbone that is readily decomposable by an acid and is useful particularly as resist materials. The present invention has been made on the basis of these findings.

Specifically, the present invention provides, in an embodiment, a hyperbranched polymer derived from, via reaction, monomers including a monomer (X) and a monomer (Y). The monomer (X) contains three or more hydroxy groups per molecule. The monomer (Y) contains two or more groups represented by General Formula (y) per molecule. General Formula (y) is expressed as follows:

[Chem. 1]

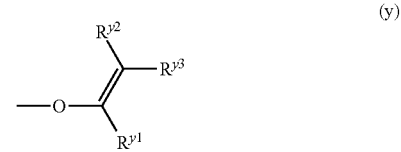

where $R^{y1}$ is selected from hydrogen and $C_1$-$C_{16}$ alkyl; and $R^{y2}$ and $R^{y3}$ are each, identically or differently, selected from hydrogen, alkyl, and cycloalkyl, where at least two of $R^{y1}$, $R^{y2}$, and $R^{y3}$ may be linked to each other to form a ring with the adjacent one or two carbon atoms. The monomer (X) includes at least one compound selected from the group consisting of cyclodextrins, compounds represented by General Formula (I), pillararenes, compounds represented by General Formula (II), compounds represented by General Formula (III), and compounds represented by General Formula (IV). The monomer (Y) includes a compound represented by General Formula (1). General Formulae (I), (II), (III), (IV), and (1) are expressed as follows:

[Chem. 2]

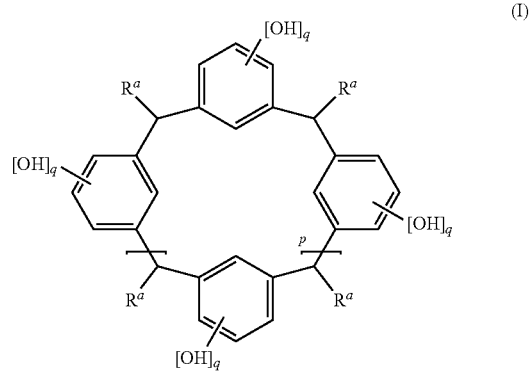

where p is selected from 1, 3, and 5; q represents, identically or differently in each occurrence, an integer of 1 to 3; and $R^a$ is, independently in each occurrence, selected from hydrogen, $C_1$-$C_4$ alkyl, and t-butylphenyl,

[Chem. 3]

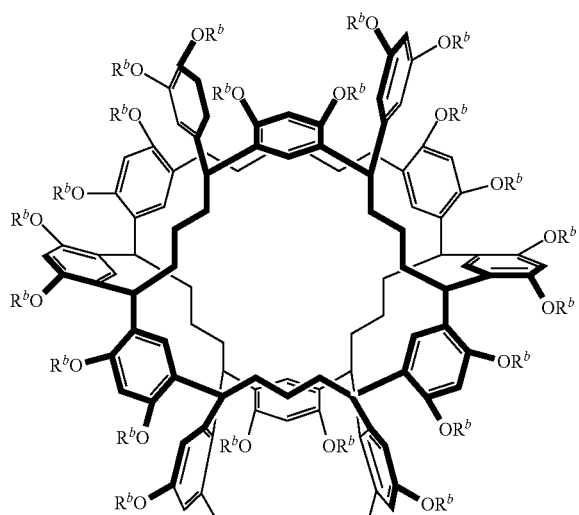

(II)

where $R^b$ is, identically or differently in each occurrence, selected from hydrogen and alkyl, where at least three occurrences of $R^b$ are hydrogen atoms,

[Chem. 4]

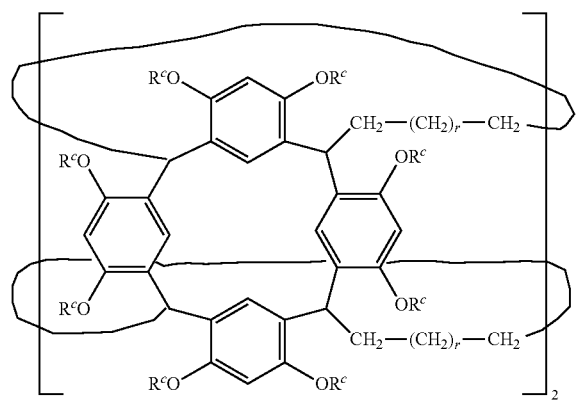

(III)

where $R^c$ is, identically or differently in each occurrence, selected from hydrogen and alkyl, where at least three occurrences of $R^c$ are hydrogen atoms; and r represents, independently in each occurrence, an integer of 1 to 4,

[Chem. 5]

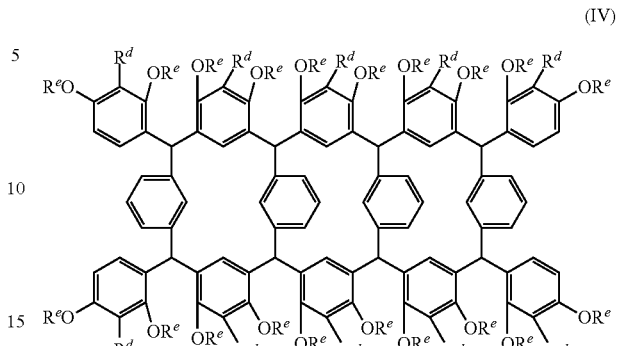

(IV)

where $R^d$ represents, identically or differently in each occurrence, alkyl; and $R^e$ is, identically or differently in each occurrence, selected from hydrogen and alkyl, where at least three occurrences of $R^e$ are hydrogen atoms,

[Chem. 6]

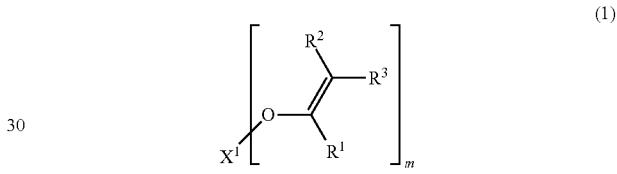

(1)

where $R^1$ is, independently in each occurrence, selected from hydrogen and $C_1$-$C_{16}$ alkyl; $R^2$ and $R^3$ are, identically or differently in each occurrence, selected from hydrogen, alkyl, and cycloalkyl, where at least two of $R^1$, $R^2$, and $R^3$ may be linked to each other to form a ring with the adjacent one or two carbon atoms; $X^1$ represents an m-valent organic group; and m represents an integer of 2 or more, where occurrences of the group in the brackets with "m" may be identical to or different from each other.

In the hyperbranched polymer, the compounds represented by General Formula (1) may be selected from compounds represented by General Formula (2):

[Chem. 7]

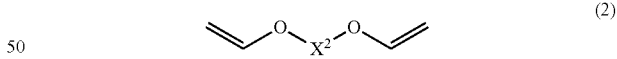

(2)

where $X^2$ is selected from: a divalent hydrocarbon group optionally having one or more occurrences of at least one substituents selected from the group consisting of hydroxy, alkoxys, carboxy, alkoxycarbonyls, acyls, aminos, sulfo, halogens, cyano, and nitro; a divalent heterocyclic group optionally having one or more of the substituents; and a divalent group including one or more hydrocarbon groups and one or more heterocyclic groups bonded to each other and optionally having one or more of the substituents.

In the hyperbranched polymer, $X^2$ in General Formula (2) may be selected from: a divalent aliphatic hydrocarbon group; a divalent alicyclic hydrocarbon group; a divalent heterocyclic group; and a $C_4$-$C_{10}$ divalent group including, as bonded to each other, two or more groups selected from the group consisting of aliphatic hydrocarbon groups, alicyclic hydrocarbon groups, and heterocyclic groups.

The hyperbranched polymer may have a number-average molecular weight of 2000 to 20000.

In the hyperbranched polymer, the monomers to constitute the hyperbranched polymer may further include, in addition to the monomer (X) and the monomer (Y), a compound represented by General Formula (3):

[Chem. 8]

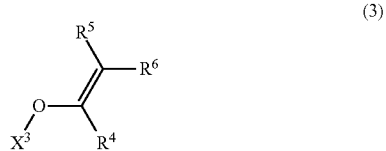

(3)

where $R^4$ is selected from hydrogen and $C_1$-$C_{16}$ alkyl; $R^5$ and $R^6$ are each, identically or differently, selected from hydrogen, alkyl, and cycloalkyl, where at least two of $R^4$, $R^5$, and $R^6$ may be linked to each other to form a ring with the adjacent one or two carbon atoms; and $X^3$ represents a monovalent organic group devoid of groups represented by —O—$CR^4$=$CR^5R^6$.

The present invention also provides, in another embodiment, a composition including the hyperbranched polymer, a photoacid generator, and an organic solvent. The composition may be used as or in photoresists. The present invention also provides, in other embodiments, a cured product of the composition, and a method for patterning (method for forming a pattern). The method includes applying the composition onto a base material or substrate. The applied composition is cured, and then subjected to development.

The present invention also provides, in yet another embodiment, a method for producing a hyperbranched polymer. The method includes the step of reacting monomers with each other. The monomers include a monomer (X) containing three or more hydroxy groups per molecule, and a monomer (Y) containing two or more groups represented by General Formula (y) per molecule. General Formula (y) is expressed as follows:

[Chem. 9]

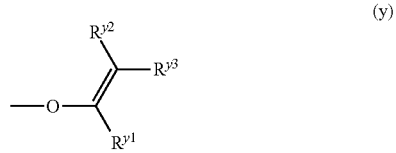

(y)

where $R^{y1}$ is selected from hydrogen and $C_1$-$C_{16}$ alkyl; $R^{y2}$ and $R^{y3}$ are each, identically or differently, selected from hydrogen, alkyl, and cycloalkyl, where at least two of $R^{y1}$, $R^{y2}$, and $R^{y3}$ may be linked to each other to form a ring with the adjacent one or two carbon atoms. The monomer (X) to be reacted includes at least one compound selected from the group consisting of cyclodextrins, compounds represented by General Formula (I), pillararenes, compounds represented by General Formula (II), compounds represented by General Formula (III), and compounds represented by General Formula (IV). The monomer (Y) to be reacted includes a compound represented by General Formula (1). General Formulae (I), (II), (III), (IV), and (1) are expressed as follows:

[Chem. 10]

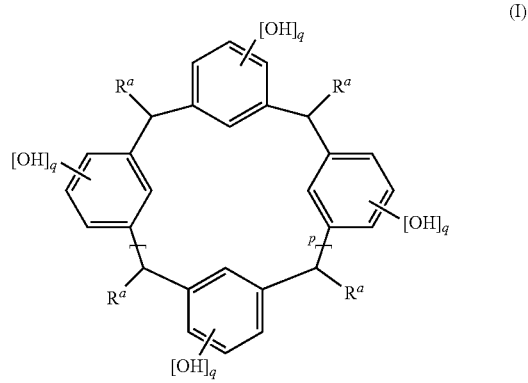

(I)

where p is selected from 1, 3, and 5; q represents, identically or differently in each occurrence, an integer of 1 to 3; and $R^a$ is, independently in each occurrence, selected from hydrogen, $C_1$-$C_4$ alkyl, and t-butylphenyl,

[Chem. 11]

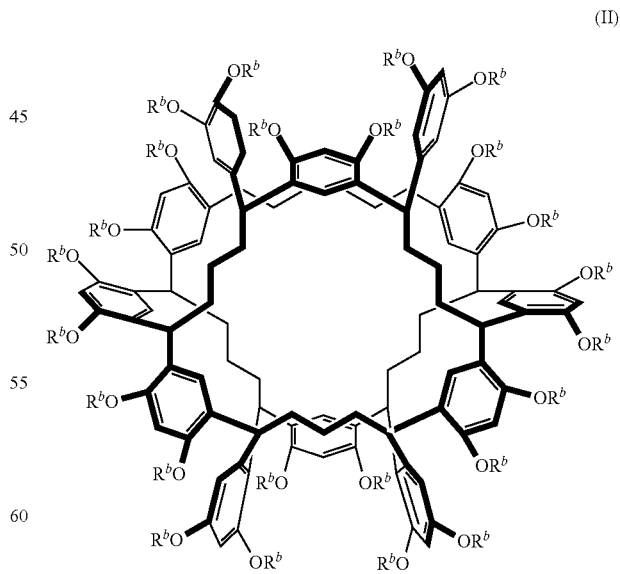

(II)

where $R^b$ is, identically or differently in each occurrence, selected from hydrogen and alkyl, where at least three occurrences of $R^b$ are hydrogen atoms,

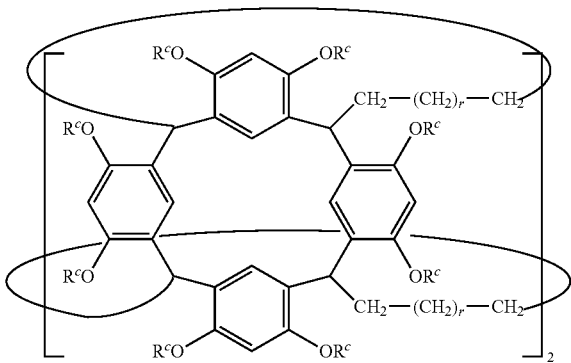

(III)

where $R^c$ is, identically or differently in each occurrence, selected from hydrogen and alkyl, where at least three occurrences of $R^c$ are hydrogen atoms; and r represents, independently in each occurrence, an integer of 1 to 4,

[Chem. 13]

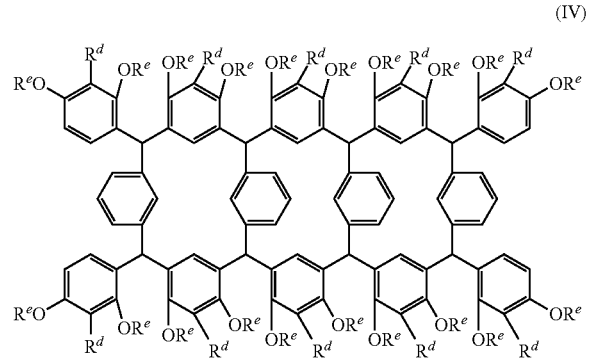

(IV)

where $R^d$ represents, identically or differently in each occurrence, alkyl; and $R^e$ is, identically or differently in each occurrence, selected from hydrogen and alkyl, where at least three occurrences of $R^e$ are hydrogen atoms,

[Chem. 14]

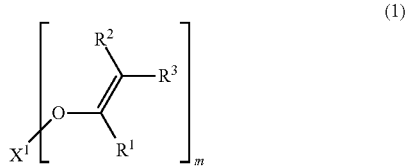

(1)

where $R^1$ is selected from hydrogen and $C_1$-$C_{16}$ alkyl; $R^2$ and $R^3$ are, identically or differently in each occurrence, selected from hydrogen, alkyl, and cycloalkyl, where at least two of $R^1$, $R^2$, and $R^3$ may be linked to each other to form a ring with the adjacent one or two carbon atoms; $X^1$ represents an m-valent organic group; and m represents an integer of 2 or more, where occurrences of the group in the brackets with "m" may be identical to or different from each other.

Specifically, the present invention relates to the followings.

(1) The present invention relates to a hyperbranched polymer derived from, via reaction, monomers including a monomer (X) and a monomer (Y). The monomer (X) contains three or more hydroxy groups per molecule. The monomer (Y) contains two or more groups represented by General Formula (y) per molecule. The monomer (X) includes at least one compound selected from the group consisting of cyclodextrins, compounds represented by General Formula (I), pillararenes, compounds represented by General Formula (II), compounds represented by General Formula (III), and compounds represented by General Formula (IV). The monomer (Y) includes a compound represented by General Formula (1).

(2) In the hyperbranched polymer according to (1), the compounds represented by General Formula (1) may be selected from compounds represented by General Formula (2).

(3) In the hyperbranched polymer according to (2), $X^2$ in General Formula (2) may be selected from a divalent aliphatic hydrocarbon group; a divalent alicyclic hydrocarbon group; a divalent heterocyclic group; and a $C_4$-$C_{10}$ divalent group including two or more groups, as bonded to each other, selected from the group consisting of aliphatic hydrocarbon groups, alicyclic hydrocarbon groups, and heterocyclic groups.

(4) In the hyperbranched polymer according to any one of (1) to (3), the compounds represented by General Formula (1) may be at least one compound selected from the group consisting of compounds represented by after-mentioned Formulae (2a) to (2y).

(5) In the hyperbranched polymer according to any one of (1) to (4), the compounds represented by General Formula (1) may be at least one compound selected from the group consisting of the compound represented by Formula (2t), the compound represented by Formula (2x), and the compound represented by Formula (2y).

(6) The hyperbranched polymer according to any one of (1) to (5) may have a number-average molecular weight of 2000 to 20000.

(7) The hyperbranched polymer according to any one of (1) to (6) may have a molecular-weight dispersity (Mw/Mn) of 1.10 to 10.

(8) In the hyperbranched polymer according to any one of (1) to (7), the monomers to constitute the hyperbranched polymer may further include a compound represented by General Formula (3), in addition to the monomer (X) and the monomer (Y).

(9) In the hyperbranched polymer according to (8), the compound represented by General Formula (3) may include at least one compound selected from the group consisting of compounds represented by after-mentioned Formulae (3a) to (3s).

(10) In the hyperbranched polymer according to one of (8) and (9), the compound represented by General Formula (3) may include at least one compound selected from the group consisting of the compound represented by Formula (31), the compound represented by Formula (3q), the compound represented by Formula (3r), and the compound represented by Formula (3s).

(11) The present invention also relates to a composition including the hyperbranched polymer according to any one of (1) to (10), a photoacid generator, and an organic solvent.

(12) The composition according to (11) may contain the hyperbranched polymer in a content (proportion) of 0.1 to 70 weight percent.

(13) The composition according to one of (12) and (13) may contain the photoacid generator in a content (proportion) of 0.1 to 30 parts by weight per 100 parts by weight of the hyperbranched polymer.

(14) The composition according to any one of (11) to (13) may be used as or for photoresists.

(15) The present invention also relates to a cured product of the composition according to any one of (11) to (14).

(16) The present invention also relates to a method for patterning. The method includes applying the composition according to any one of (11) to (14) onto a base material or substrate. The applied composition is cured, and then subjected to development.

(17) The present invention also relates to a method for producing a hyperbranched polymer. The method includes the step of reacting monomers with each other. The monomers include a monomer (X) containing three or more hydroxy groups per molecule, and a monomer (Y) containing two or more groups represented by General Formula (y) per molecule. The monomer (X) includes at least one compound selected from the group consisting of cyclodextrins, compounds represented by General Formula (I), pillararenes, compounds represented by General Formula (II), compounds represented by General Formula (III), and compounds represented by General Formula (IV). The monomer (Y) includes a compound represented by General Formula (1).

Advantageous Effects of Invention

The hyperbranched polymer according to the present invention has the configuration and contains such a backbone that is readily decomposable by an acid. For example, assume that the hyperbranched polymer according to the present invention is used as a resist material (in particular, as a photoresist material). In this case, the backbone of the hyperbranched polymer can be readily decomposed by the action of an acid which is generated via a means such as application of light and/or heat. The hyperbranched polymer according to the present invention is such a material that can offer solubility in developers not by side chain degradation, but by backbone decomposition. The hyperbranched polymer therefore provides excellent surface smoothness after development and offers good sensitivity even upon the use of low-power light sources. Thus, compositions including the hyperbranched polymer according to the present invention as an essential component are useful as resist materials (in particular, as photoresist materials) and offer resolution, LWR, and sensitivity at excellent levels.

BRIEF DESCRIPTION OF DRAWINGS

FIG. 1 is an FT-IR spectrum chart of a hyperbranched polymer obtained in Example 1;

FIG. 2 is a diagram illustrating a $^1$H-NMR spectrum chart, and the result of identification on the basis thereof, of the hyperbranched polymer obtained in Example 1;

FIG. 3 is a graph illustrating the rate of change of an acetal-group-derived peak in an RT-FTIR spectrum measured in Example 2, with the ordinate indicating the intensity ratio of the acetal-group-derived peak, and the abscissa indicating the time;

FIG. 4 is a graph for determining the reaction rate constant of a decomposition reaction performed in Example 2, with the ordinate indicating −ln([Intensity of the acetal-group-derived peak at a time of t seconds]/[Intensity of the acetal-group-derived peak at a time of 0 second]), and the abscissa indicating the time (second));

FIG. 5 is a graph illustrating the rate of change of an acetal-group-derived peak in an RT-FTIR spectrum measured in Example 3, with the ordinate indicating the intensity ratio of the acetal-group-derived peak, and the abscissa indicating the time;

FIG. 6 is a graph for determining the reaction rate constant of a decomposition reaction performed in Example 3, with the ordinate indicating −ln([Intensity of the acetal-group-derived peak at a time of t seconds]/[Intensity of the acetal-group-derived peak at a time of 0 second]), and the abscissa indicating the time (second));

FIG. 7 is an FT-IR spectrum chart of a hyperbranched polymer obtained in Example 4;

FIG. 8 is a diagram illustrating a $^1$H-NMR spectrum chart, and the result of identification on the basis thereof, of the hyperbranched polymer obtained in Example 4;

FIG. 9 is a graph illustrating the rate of change of an acetal-group-derived peak in an RT-FTIR spectrum measured in Example 4, with the ordinate indicating the intensity ratio of the acetal-group-derived peak, and the abscissa indicating the time;

FIG. 10 is a graph for determining the reaction rate constant of a decomposition reaction performed in Example 4, with the ordinate indicating −ln([Intensity of the acetal-group-derived peak at a time of t seconds]/[Intensity of the acetal-group-derived peak at a time of 0 second]), and the abscissa indicating the time (second));

FIG. 11 is a diagram illustrating a $^1$H-NMR spectrum chart, and the result of identification on the basis thereof, of a product obtained in Production Example 1;

FIG. 12 is a diagram illustrating a $^1$H-NMR spectrum chart, and the result of identification on the basis thereof, of a hyperbranched polymer obtained in Example 5;

FIG. 13 is a graph of a sensitivity curve plotted in sensitivity evaluation of a hyperbranched polymer (poly(CAR[4]-co-DICH)), with the ordinate indicating the thickness of a thin film obtained via exposure, and the abscissa indicating the amount of exposure;

FIG. 14 is a graph for determining an etching rate in etch resistance evaluation 1, with the ordinate indicating the decrease of film thickness by etching (film thickness loss), and the abscissa indicating the time; and FIG. 15 is a graph for determining an etching rate in etch resistance evaluation 2, with the ordinate indicating the decrease of film thickness by etching (film thickness loss), and the abscissa indicating the time.

DESCRIPTION OF EMBODIMENTS

Hyperbranched Polymer

The hyperbranched polymer according to the present invention is a polymer obtained by subjecting a monomer (X) and a monomer (Y) to a reaction (addition polymerization). The "monomer (X)" refers to a compound (polyhydroxy compound) containing three or more hydroxy groups per molecule. The "monomer (Y)" refers to a compound containing two or more groups represented by General Formula (y) per molecule. Specifically, the hyperbranched polymer according to the present invention is a polymer formed by subjecting the hydroxy groups in the molecule of the monomer (X) and the groups represented by General Formula (y) (such as vinyl ether groups) in the molecule of the monomer (Y) to at least an addition reaction (addition polymerization). The monomer (X) contains three or more hydroxy groups per molecule, and the monomer (Y) contains two or more groups represented by General Formula (y) per molecule. Thus, the hyperbranched polymer according to the present invention has a highly branched structure (hyperbranched structure). In addition, the reaction between the hydroxy groups of the monomer (X) and the groups represented by General Formula (y) of the monomer (Y) gives an acetal group (acetal bond; —O—C($R^{y1}$)(CH$R^{y2}R^{y3}$)—O—). The hyperbranched polymer according to the present invention therefore has an acetal group or groups in the backbone.

[Chem. 15]

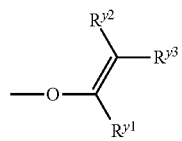

(y)

In General Formula (y), $R^{y1}$ is selected from hydrogen and $C_1$-$C_{16}$ alkyl; and $R^{y2}$ and $R^{y3}$ are each, identically or differently, selected from hydrogen, alkyl, and cycloalkyl, where at least two of $R^{y1}$, $R^{y2}$, and $R^{y3}$ may be linked to each other to form a ring with the adjacent one or two carbon atoms. Examples of $R^{y1}$, $R^{y2}$, and $R^{y3}$ are as with those exemplified respectively as $R^1$, $R^2$, and $R^3$ in after-mentioned General Formula (1).

In particular, the hyperbranched polymer according to the present invention is derived from a compound (A) and a compound (B) respectively as the monomer (X) and as the monomer (Y). The "compound (A)" refers to at least one compound selected from the group consisting of cyclodextrins, compounds represented by General Formula (I), pillararenes, compound represented by General Formula (II), compound represented by General Formula (III), and compound represented by General Formula (IV). The "compound (B)" refers to a compound represented by General Formula (1). General Formulae (I), (II), (III), (IV), and (1) are expressed as follows:

[Chem. 16]

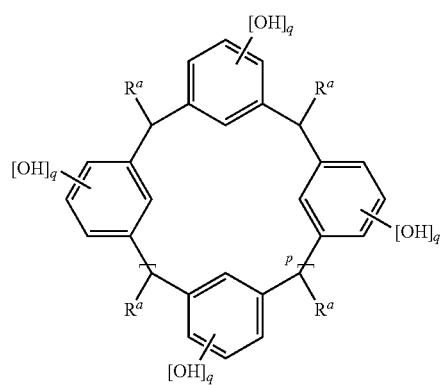

(I)

[Chem. 17]

(II)

[Chem. 18]

(III)

[Chem. 19]

(IV)

[Chem. 20]

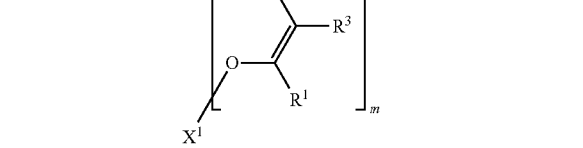

(1)

Compound (A)

The compound (A), which is an essential monomer to constitute the hyperbranched polymer according to the present invention, is at least one compound selected from the group consisting of cyclodextrins, the compounds represented by General Formula (I), pillararenes, the compounds represented by General Formula (II), the compounds represented by General Formula (III), and the compounds represented by General Formula (IV), as described above. Since being derived from the compound (A) as an essential monomer, the hyperbranched polymer according to the present invention has a highly branched structure (hyperbranched structure). As compared with linear polymers, the hyperbranched polymer therefore offers solubility and film-formability at better levels, has photoreaction sites in a larger number, and offers better photodegradability. In addition, the compound (A) has excellent reactivity with the monomer (Y) probably because the hydroxy groups are arranged at fixed positions in the compound (A). This allows the hyperbranched polymer to contain approximately no or little residual hydroxy groups in some proportions between the monomers. The hyperbranched polymer as above has, in particular, excellent resistance to developers (e.g., is not dissolved in, or does not swell with, developers) and contributes to higher levels of resolution, LWR, and sensitivity of resist materials.

The number of hydroxy groups per molecule of the compound (A) is not limited, but is preferably 4 or more (e.g., 4 to 10), and more preferably 5 to 8. The compound (A), when containing hydroxy groups in a number of 10 or less, tends to allow the hyperbranched polymer to resist gelation and to have better solubility in organic solvents.

When the compound (A) contains four or more hydroxy group per molecule, hydroxy group or groups other than at least three hydroxy groups may be protected with protecting groups. When the hydroxy group or groups of the compound (A) are protected with protecting groups (leaving protecting groups), the protecting groups may be selected from hydroxy-protecting groups commonly used in the field of organic synthesis and are not limited. Non-limiting examples of such protecting groups include groups capable of forming an acetal group or hemiacetal group with a hydroxy group or groups, including alkyls such as methyl, t-butyl, and other $C_1$-$C_4$ alkyls; alkenyls such as allyl; cycloalkyls such as cyclohexyl; aryls such as 2,4-dinitrophenyl; aralkyls such as benzyl, 2,6-dichlorobenzyl, 3-bromobenzyl, 2-nitrobenzyl, and triphenylmethyl); substituted methyls such as methoxymethyl, methylthiomethyl, benzyloxymethyl, t-butoxymethyl, 2-methoxyethoxymethyl, 2,2,2-trichloroethoxymethyl, bis(2-chloroethoxy)methyl, and 2-(trimethylsilyl)ethoxymethyl; substituted ethyls such as 1-ethoxyethyl, 1-methyl-1-methoxyethyl, 1-isopropoxyethyl, 2,2,2-trichloroethyl, and 2-methoxyethyl; tetrahydropyranyl; tetrahydrofuranyl; and 1-hydroxyalkyls such as 1-hydroxyethyl, 1-hydroxyhexyl, 1-hydroxydecyl, 1-hydroxyhexadecyl, and 1-hydroxy-1-phenylmethyl. Non-limiting examples of the protecting groups also include acyls including aliphatic saturated or unsaturated acyls exemplified by $C_1$-$C_{20}$ aliphatic acyls such as formyl, acetyl, propionyl, butyryl, isobutyryl, valeryl, pivaloyl, hexanoyl, heptanoyl, octanoyl, nonanoyl, decanoyl, lauroyl, myristoyl, palmitoyl, and stearoyl; acetoacetyl; alicyclic acyls exemplified by cycloalkanecarbonyls such as cyclopentanecarbonyl and cyclohexanecarbonyl; and aromatic acyls such as benzoyl and naphthoyl. Non-limiting examples of the protecting groups also include sulfonyls such as methanesulfonyl, ethanesulfonyl, trifluoromethanesulfonyl, benzenesulfonyl, p-toluenesulfonyl, and naphthalenesulfonyl; alkoxycarbonyls exemplified by $C_1$-$C_4$ alkoxy-carbonyls such as methoxycarbonyl, ethoxycarbonyl, and t-butoxycarbonyl; aralkyloxycarbonyls such as benzyloxycarbonyl and p-methoxybenzyloxycarbonyl; substituted or unsubstituted carbamoyls such as carbamoyl, methylcarbamoyl, and phenylcarbamoyl; groups resulting from removing OH group from inorganic acids (such as sulfuric acid, nitric acid, phosphoric acid, and boric acid); dialkylphosphinothioyls such as dimethylphosphinothioyl; diarylphosphinothioyls such as diphenylphosphinothioyl; and substituted silyls such as trimethylsilyl, t-butyldimethylsilyl, tribenzylsilyl, and triphenylsilyl. The hydroxy-protecting groups are preferably groups capable of readily leaving upon reaction, and from this viewpoint, are preferably selected from alkyls and acyls.

The cyclodextrins, which belong to the compound (A), may be selected from known or common cyclodextrins, are not limited, but are exemplified typically by α-cyclodextrin, β-cyclodextrin, and γ-cyclodextrin; compounds resulting from protecting part or all of hydroxy groups of these cyclodextrins with the protecting groups; and derivatives of them (such as alkylated cyclodextrins and hydroxyalkylated cyclodextrins). The monomers to constitute the hyperbranched polymer according to the present invention may include each of different cyclodextrins alone or in combination. Of the cyclodextrins, α-cyclodextrin and β-cyclodextrin are preferred because these compounds are available at low cost and tend to give hyperbranched polymers having excellent solubility in organic solvents.

The compounds represented by General Formula (I) (cyclic phenol derivatives), which belong to the compound (A), are compounds known as so-called calixarenes. In General Formula (I), p is selected from 1, 3, and 5; q represents, identically or differently in each occurrence, an integer of 1 to 3; and $R^a$ is, independently in each occurrence, selected from hydrogen, $C_1$-$C_4$ alkyl, and t-butylphenyl (in particular, 4-t-butylphenyl). The monomers to constitute the hyperbranched polymer according to the present invention may include each of different compounds represented by General Formula (I) alone or in combination.

More specifically, non-limiting examples of the compounds represented by General Formula (I) include compounds represented by Formula (a), compounds (resorcinol arene derivatives) represented by Formula (b), and compounds (pyrogallol arene derivatives) represented by Formula (c). Of the compounds represented by General Formula (I), preferred are compounds (calixresorcarenes) represented by Formula (b). Formulae (a), (b), and (c) are expressed as follows:

[Chem. 21]

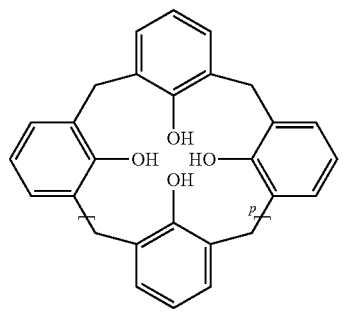

(a)

where p is as defined above and is selected from 1, 3, and 5,

[Chem. 22]

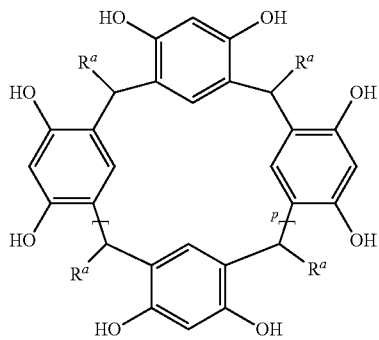

(b)

where p is as defined above and is selected from 1, 3, and 5; and $R^a$ is as defined above and is selected from hydrogen, $C_1$-$C_4$ alkyl, and t-butylphenyl (in particular, 4-t-butylphenyl),

[Chem. 23]

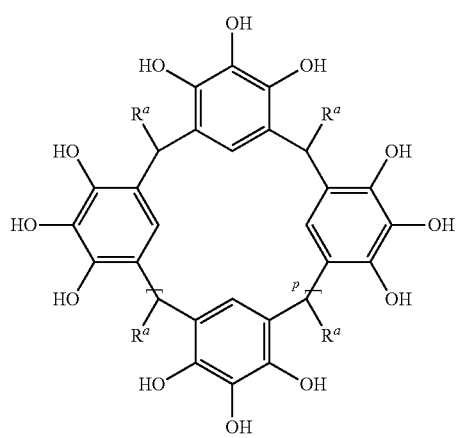

(c)

where p is as defined above and is selected from 1, 3, and 5; and $R^a$ is as defined above and is selected from hydrogen, $C_1$-$C_4$ alkyl, and t-butylphenyl (in particular, 4-t-butylphenyl).

The pillararenes, which belong to the compound (A), may be selected from known or common pillararenes, are not limited, but are exemplified typically by pillar[5]arenes. More specifically, non-limiting examples of the pillararenes include compounds (pillar[5]arenes) represented by Formula (d):

[Chem. 24]

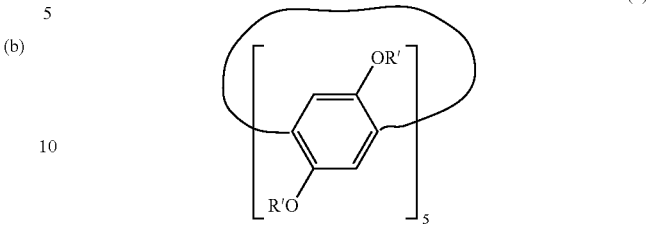

(d)

where R' is, independently in each occurrence, selected from hydrogen and alkyl (such as methyl), where at least three occurrences of R' are hydrogen atoms.

The compounds represented by General Formula (II), which belong to the compound (A), are compounds known as so-called Noria and derivatives thereof (see, for example, Angewandte Chemie Int. Ed. 45, 7948-7952 (2006); and Chemistry Letters 38(12), 1198-1199 (2009)). In General Formula (II), $R^b$ is, identically or differently in each occurrence, selected from hydrogen and alkyl (such as methyl, ethyl, or another $C_1$-$C_4$ alkyl), where at least three occurrences of $R^b$ are hydrogen atoms. The monomers to constitute the hyperbranched polymer according to the present invention may include each of different compounds represented by General Formula (II) alone or in combination. More specifically, non-limiting examples of the compounds represented by General Formula (II) include Noria, which is a compound represented by Formula (e); Noria-OEt, which is a compound represented by Formula (f); and Noria-MeO, which is a compound represented by Formula (g). Formulae (e), (f), and (g) are expressed as follows:

[Chem. 25]

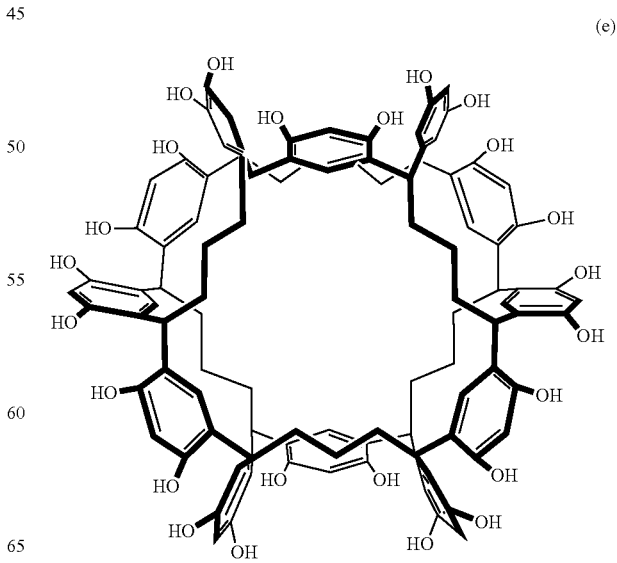

(e)

[Chem. 26]

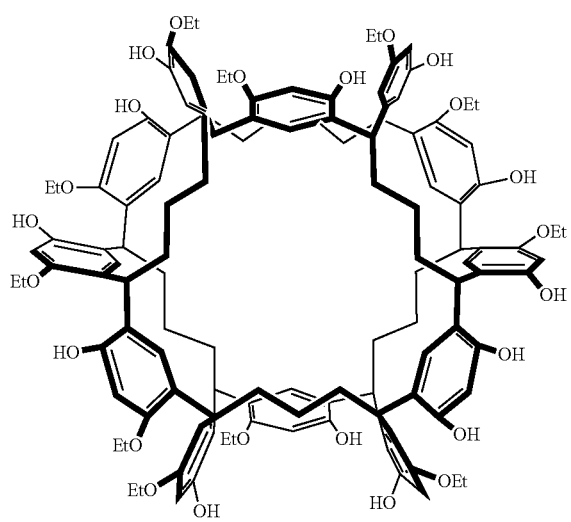

(f)

[Chem. 27]

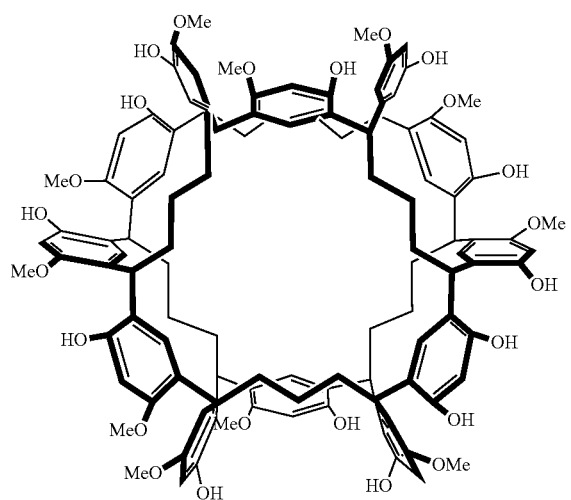

(g)

The compounds represented by General Formula (III), which belong to the compound (A), are compounds known as so-called calixarene dimers (see, for example, JP-A No. 2008-280269; and Org. Lett., 2012, 14, 4510). In General Formula (III), $R^c$ is, identically or differently in each occurrence, selected from hydrogen and alkyl (such as methyl, ethyl, or another $C_1$-$C_4$ alkyl), where at least three occurrences of $R^c$ are hydrogen atoms; and r represents, independently in each occurrence, an integer of 1 to 4 (in particular, preferably 2). The monomers to constitute the hyperbranched polymer according to the present invention may include each of different compounds represented by General Formula (III) alone or in combination.

The compounds represented by General Formula (IV), which belong to the compound (A), are compounds known as so-called Triple-ringed[14]arenes (see, for example, Chemistry Letters. 41, 699-701). In General Formula (IV), $R^d$ represents, identically or differently in each occurrence, alkyl. Non-limiting examples of the alkyl include $C_1$-$C_3$ alkyls such as methyl, ethyl, propyl, and isopropyl. $R^e$ in General Formula (IV) is, identically or differently in each occurrence, selected from hydrogen and alkyl (such as methyl, ethyl, or another $C_1$-$C_4$ alkyl), where at least three occurrences of $R^e$ are hydrogen atoms. The monomers to constitute the hyperbranched polymer according to the present invention may include each of different compounds represented by General Formula (IV) alone or in combination.

The compound (A) may be produced by a well-known, common method, or may be available as commercial products.

Examples of monomers, for use as the monomer (X), other than the compound (A) include, but are not limited to, known or common compounds containing three or more hydroxy groups per molecule. Such monomer or monomers other than the compound (A) may be used as the monomer (X) in combination with the compound (A), or not (namely, the monomer (X) for use herein may include the compound (A) alone).

Compound (B)

The compound (B) as an essential monomer to constitute the hyperbranched polymer according to the present invention is selected from compounds (vinyl ether compounds) represented by General Formula (1). Since being derived from the compound (B) as an essential monomer, the hyperbranched polymer according to the present invention has a structure (backbone-decomposable structure) containing acid-degradable acetal groups in its polymer backbone and advantageously has such resolution performance that is independent on the polymer size. In addition, the hyperbranched polymer has reaction sites in a larger number as compared with side-chain-decomposable hyperbranched polymers and is expected to have better LWR, where the LWR indicates variations in line width of resist materials.

In General Formula (1), $R^1$ is, independently in each occurrence, selected from hydrogen and $C_1$-$C_{16}$ alkyl. Non-limiting examples of the $C_1$-$C_{16}$ alkyl include linear or branched alkyls such as methyl, ethyl, propyl, isopropyl, butyl, isobutyl, s-butyl, pentyl, hexyl, heptyl, octyl, and ethylhexyl. In General Formula (1), $R^2$ and $R^3$ are each, identically or differently in each occurrence, selected from hydrogen, alkyl, and cycloalkyl. Non-limiting examples of the alkyl include the linear or branched alkyls. Non-limiting examples of the cycloalkyl include $C_3$-$C_{10}$ cycloalkyls such as cyclopropyl, cyclobutyl, cyclopentyl, cyclohexyl, and methylcyclohexyl. At least two of $R^1$, $R^2$, and $R^3$ in General Formula (1) may be linked to each other to form a ring with the adjacent one or two carbon atoms. Non-limiting examples of the ring include non-aromatic carbon rings (including cycloalkane rings, cycloalkene rings, and bridged carbon rings) containing 3 to about 20 members, such as cyclopropane, cyclopropene, cyclobutane, cyclobutene, cyclopentane, cyclopentene, cyclohexane, cyclohexene, cyclooctane, cyclooctene, cyclodecane, norbornane, norbornene, adamantane, and tricyclo[5.2.1.0$^{2,6}$]decane rings. Each of these rings may have one or more substituents and/or may be fused with another ring (non-aromatic ring or aromatic ring). Non-limiting examples of the substituents include hydroxy, alkoxys, carboxy, alkoxycarbonyls, acyls, aminos, sulfo, halogens, cyano, and nitro.

In particular, $R^1$, $R^2$, and $R^3$ in General Formula (1) are preferably selected from hydrogen and $C_1$-$C_4$ alkyl, and are more preferably hydrogen atoms. Especially, all of $R^1$, $R^2$, and $R^3$ are preferably hydrogen atoms.

In General Formula (1), m represents an integer of 2 or more. The number m is not limited, but is preferably an integer of 2 to 6, more preferably an integer of 2 to 4, and furthermore preferably 2 or 3. Control of m within this range tends to give hyperbranched polymers having more excellent solubility in organic solvents.

In General Formula (1), $X^1$ represents an m-valent organic group. Non-limiting examples of the m-valent organic group include m-valent aliphatic hydrocarbon groups, m-valent alicyclic hydrocarbon groups, m-valent aromatic hydrocarbon groups, m-valent heterocyclic groups, and co-valent groups each including two or more of these groups bonded to each other. Non-limiting examples of the aliphatic hydrocarbon groups include $C_1$-$C_8$ (preferably $C_1$-$C_4$) linear or branched hydrocarbon groups. Non-limiting examples of the alicyclic hydrocarbon groups include $C_3$-$C_8$ monocyclic alicyclic hydrocarbon groups and $C_4$-$C_{20}$ (preferably $C_6$-$C_{10}$) polycyclic alicyclic hydrocarbon groups. Non-limiting examples of the aromatic hydrocarbon groups include $C_6$-$C_{10}$ (preferably $C_6$-$C_{10}$) aromatic hydrocarbon groups. Non-limiting examples of the heterocyclic groups include $C_2$-$C_6$ aromatic or non-aromatic heterocyclic groups each including one to four occurrences of at least one heteroatom selected from nitrogen, oxygen, and sulfur. Each of these groups (aliphatic hydrocarbon groups, alicyclic hydrocarbon groups, aromatic hydrocarbon groups, heterocyclic groups, and groups each including two or more of them bonded to each other) may have one or more substituents. Non-limiting examples of the substituents include hydroxy, alkoxys, carboxy, alkoxycarbonyls, acyls, aminos, sulfo, halogens, cyano, and nitro. The number of carbon atom(s) of each of the alkoxys, alkoxycarbonyls, and acyls is not limited, but is preferably 1 to 8, and more preferably 1 to 4. The number of carbon atom(s) of each of the aliphatic hydrocarbon groups, alicyclic hydrocarbon groups, aromatic hydrocarbon groups, heterocyclic groups, and groups each including two or more of these groups bonded to each other, as $X^1$, is not limited, but is preferably 1 to 30.

In General Formula (1), the occurrences of the group (—O—$CR^1$=$CR^2R^3$) in the brackets with "m" may be identical to or different from each other.

In particular, the compound (B) is preferably selected from compounds of Formula (1) in which m is 2, and is particularly preferably selected from compounds (divinyl ether compounds) represented by General Formula (2). This is preferred for easily giving hyperbranched polymers that have excellent solubility in organic solvents. General Formula (2) is expressed as follows:

[Chem. 28]

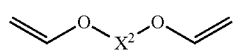
(2)

In General Formula (2), $X^2$ is selected from a divalent hydrocarbon group (substituted or unsubstituted hydrocarbon group) optionally having one or more occurrences of at least one group (substituent) selected from the group consisting of hydroxy, alkoxys, carboxy, alkoxycarbonyls, acyls, aminos, sulfo, halogens, cyano, and nitro; a divalent heterocyclic group optionally having one or more of the substituents; and a divalent group including one or more hydrocarbon groups and one or more heterocyclic groups bonded to each other and optionally having one or more of the substituents. Non-limiting examples of these groups include divalent aliphatic hydrocarbon groups; divalent alicyclic hydrocarbon groups; divalent aromatic hydrocarbon groups; divalent heterocyclic groups; and $C_1$-$C_{30}$ divalent groups each including two or more groups selected from the group consisting of aliphatic hydrocarbon groups, alicyclic hydrocarbon groups, aromatic hydrocarbon groups, and heterocyclic groups bonded to each other. Each of these groups may have one or more of the substituents. In particular, $X^2$ is preferably selected from divalent aliphatic hydrocarbon groups; divalent alicyclic hydrocarbon groups; divalent heterocyclic groups; and $C_4$-$C_{10}$ divalent groups each including two or more groups selected from the group consisting of aliphatic hydrocarbon groups, alicyclic hydrocarbon groups, and heterocyclic groups, where the $C_4$-$C_{10}$ divalent groups are exemplified typically by alkyl-substituted cycloalkylene groups, alkylene-cycloalkylene groups, alkyl-substituted heterocyclic groups, and alkylene-heterocyclic groups.

More specifically, the compound (B) is exemplified by, but is not limited to, compounds represented by Formulae (2a) to (2y):

[Chem. 29]

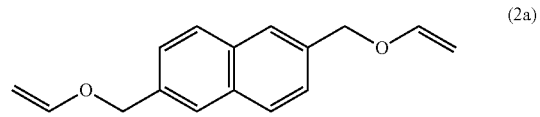
(2a)

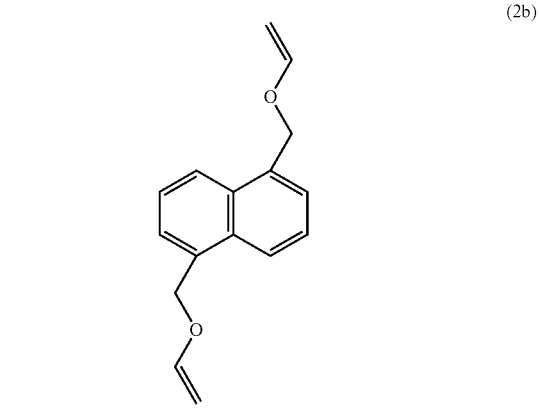
(2b)

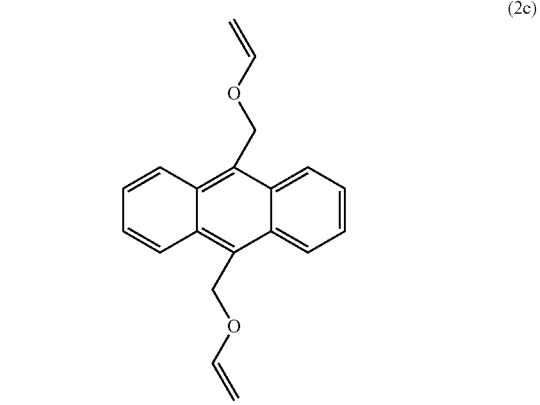
(2c)

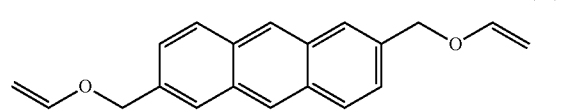
(2d)

(2e)
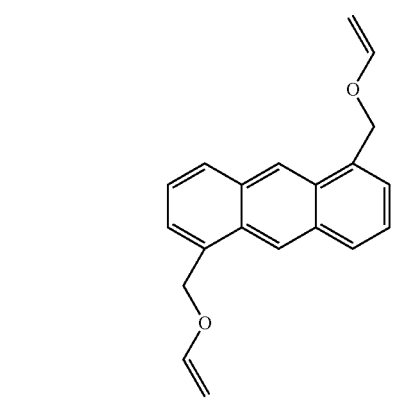
[Chem. 30]
(2f)
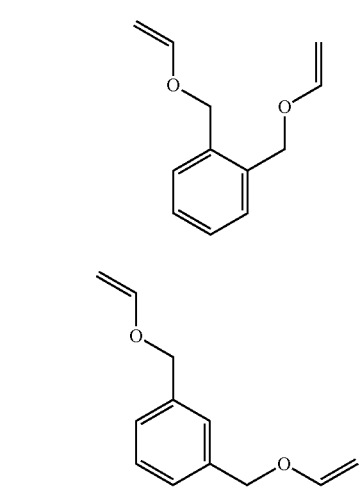
(2g)
(2h)
(2i)
(2j)
(2k)
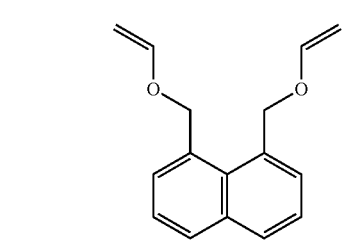
[Chem. 31]
(2l)
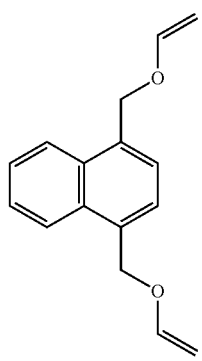
(2m)
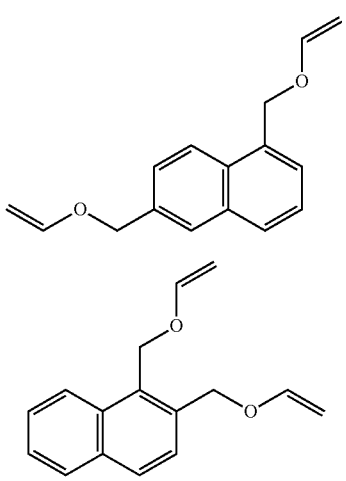
(2n)
(2o)
(2p)
[Chem. 32]
(2q)
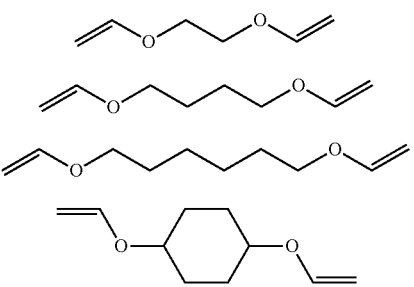
(2r)
(2s)
(2t)

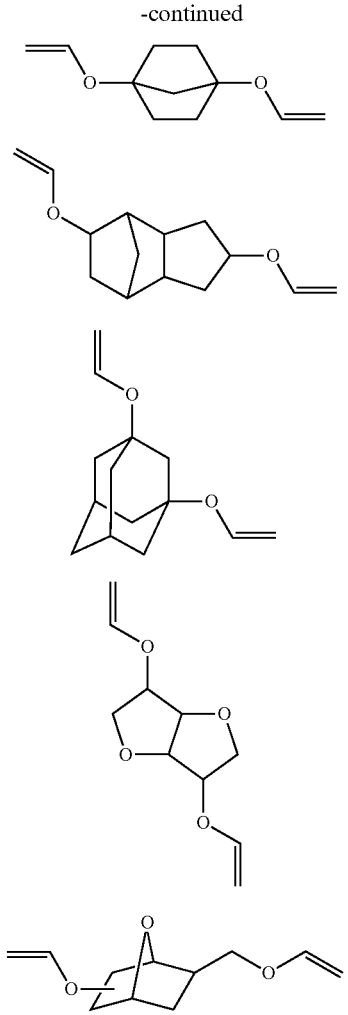

(2u)
(2v)
(2w)
(2x)
(2y)

In particular, the compound (B) is preferably selected from compounds containing an alicyclic hydrocarbon group and/or a heterocyclic group (either one or both of an alicyclic hydrocarbon group and a heterocyclic group), such as the compound represented by Formula (2t), the compound represented by Formula (2x), and the compound represented by Formula (2y). This is preferred for easily giving polymers having a multi-branched structure, such as hyperbranched polymers.

The monomers to constitute the hyperbranched polymer according to the present invention may include each of different compounds (B) alone or in combination.

The compounds (B) can be produced by a well-known, common method without limitation. For example, a compound (B) can be efficiently produced by a method of reacting a corresponding carboxylic acid vinyl ester compound with a corresponding hydroxy compound by the catalysis of a transition metal compound. Such production method is described in detail typically in JP-A No. 2004-161742. The compounds (B) are also available as commercial products.

Examples of monomers, for use as the monomer (Y), other than the compounds (B) include, but are not limited to, known or common compounds containing, per molecule, two or more groups represented by General Formula (y) (such as vinyl ether groups). Such other monomers, for use as the monomer (Y), than the compounds (B) may be used in combination with the compound (B), or not (namely, the monomer (Y) for use herein may include the compound(s) (B) alone).

The monomers to constitute the hyperbranched polymer according to the present invention may include the monomer (X) and the monomer (Y) alone, or may further include one or more monomers other than the monomer (X) and the monomer (Y). Non-limiting examples of such other monomers include compounds containing two hydroxy groups per molecule.

Monofunctional Compound

The hyperbranched polymer according to the present invention may be derived from monomers further including a monofunctional compound, in addition to the monomer (X) and the monomer (Y). Non-limiting examples of the monofunctional compound include compounds containing one or two hydroxy groups per molecule; and compounds containing one group represented by General Formula (y) (such as vinyl ether group) per molecule. Among them, the monofunctional compound is preferably selected from compounds represented by General Formula (3). Namely, the hyperbranched polymer according to the present invention may be a polymer that is derived from, via reaction, a compound represented by General Formula (3) in addition to the monomer (X) and the monomer (Y). Assume that the hyperbranched polymer according to the present invention is derived further from, via reaction, a monofunctional compound (in particular, a compound represented by General Formula (3)). This hyperbranched polymer tends to have solubility in organic solvents and resistance to developers (in particular, alkaline developers) and to water at still better levels. This is probably because the monofunctional compound has reactivity (reactivity in addition reaction) with hydroxy groups, and this efficiently decreases residual hydroxy groups. General Formula (3) is expressed as follows:

[Chem. 33]

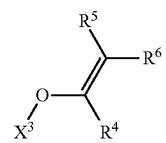

(3)

In General Formula (3), $R^4$ is selected from hydrogen and $C_1$-$C_{16}$ alkyl. Non-limiting examples of $R^4$ include groups as with $R^1$ in General Formula (1). $R^5$ and $R^6$ are each, identically or differently, selected from hydrogen, alkyl, and cycloalkyl. Non-limiting examples of $R^5$ and $R^6$ include groups as with $R^2$ and $R^3$ in General Formula (1). At least two of $R^4$, $R^5$, and $R^6$ may be linked to each other to form a ring with the adjacent one or two carbon atoms. Non-limiting examples of the ring include structures (rings) as with those exemplified in General Formula (1).

In General Formula (3), $R^4$, $R^5$, and $R^6$ are each preferably selected from hydrogen and $C_1$-$C_4$ alkyl and are more preferably hydrogen atoms. In particular, all of $R^4$, $R^5$, and $R^6$ are preferably hydrogen atoms.

In General Formula (3), $X^3$ represents a monovalent organic group devoid of groups represented by —O—$CR^4$=$CR^5R^6$. Non-limiting examples of the monovalent organic group include monovalent aliphatic hydrocarbon groups, monovalent alicyclic hydrocarbon groups, monovalent aromatic hydrocarbon groups, monovalent heterocyclic groups, and monovalent groups each including two or more of these groups bonded to each other. Non-limiting examples of the aliphatic hydrocarbon groups include $C_1$-$C_8$ (preferably $C_1$-$C_4$) linear or branched hydrocarbon groups (such as alkyls, alkenyls, and alkynyls). Non-limiting examples of the alicyclic hydrocarbon groups include $C_3$-$C_8$ monocyclic alicyclic hydrocarbon groups (such as cycloalkyls, cycloalkenyls, cycloalkynyls, and alkyl- or alkenyl-substituted cycloalkyls), and $C_4$-$C_{20}$ (preferably $C_6$-$C_{10}$) polycyclic alicyclic hydrocarbon groups (such as norbornyl). Non-limiting examples of the aromatic hydrocarbon groups include $C_6$-$C_{14}$ (preferably $C_6$-$C_{10}$) aromatic hydrocarbon groups (such as phenyl and naphthyl). Non-limiting examples of the heterocyclic groups include $C_2$-$C_6$ aromatic or non-aromatic heterocyclic groups each containing one to four occurrences of at least one heteroatom selected from the group consisting of nitrogen, oxygen, and sulfur. Non-limiting examples of the monovalent organic group also include benzyl, cyclohexylethyl, and other monovalent groups each including two or more groups selected from aliphatic hydrocarbon groups, alicyclic hydrocarbon groups, aromatic hydrocarbon groups, and heterocyclic groups bonded to each other. Each of these groups (aliphatic hydrocarbon groups, alicyclic hydrocarbon groups, aromatic hydrocarbon groups, heterocyclic groups, and groups each including two or more of these groups bonded to each other) may have one or more substituents. Non-limiting examples of the substituents include hydroxy, alkoxys, carboxy, alkoxycarbonyls, acyls, aminos, sulfo, halogens, cyano, and nitro. The number of carbon atom(s) of each of the alkoxys, alkoxycarbonyls, and acyls is not limited, but is preferably 1 to 8, and more preferably 1 to 4. The number of carbon atom(s) of each of the aliphatic hydrocarbon groups, alicyclic hydrocarbon groups, aromatic hydrocarbon groups, heterocyclic groups, and groups each including two or more of these groups bonded to each other, as $X^3$, is not limited, but is preferably 1 to 30.

Among them, $X^3$ in General Formula (3) is preferably selected from monovalent aliphatic hydrocarbon groups, monovalent alicyclic hydrocarbon groups, monovalent aromatic hydrocarbon groups, monovalent heterocyclic groups, and $C_1$-$C_{30}$ monovalent groups each including two or more of these groups bonded to each other, and $X^3$ is more preferably selected from monovalent alicyclic hydrocarbon groups. This is preferred for easily giving hyperbranched polymers that have photoreactivity, solubility in organic solvents, and resistance to developers and water at more excellent levels.

The monomers to constitute the hyperbranched polymer may include each of different compounds represented by General Formula (3) alone or in combination.

More specifically, the compounds represented by General Formula (3) are exemplified by, but are not limited to, compounds represented by Formulae (3a) to (3s):

[Chem. 34]

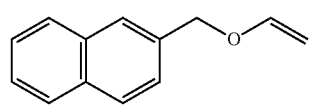
(3a)

[Chem. 35]

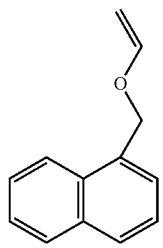
(3b)

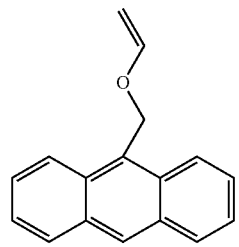
(3c)

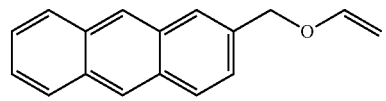
(3d)

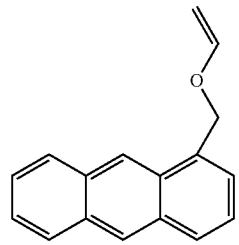
(3e)

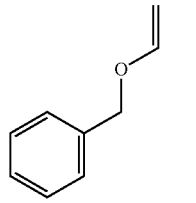
(3f)

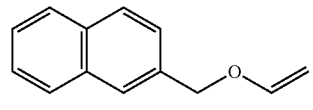
(3g)

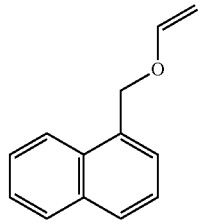
(3h)

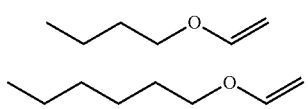
(3i)

(3j)

(3k)

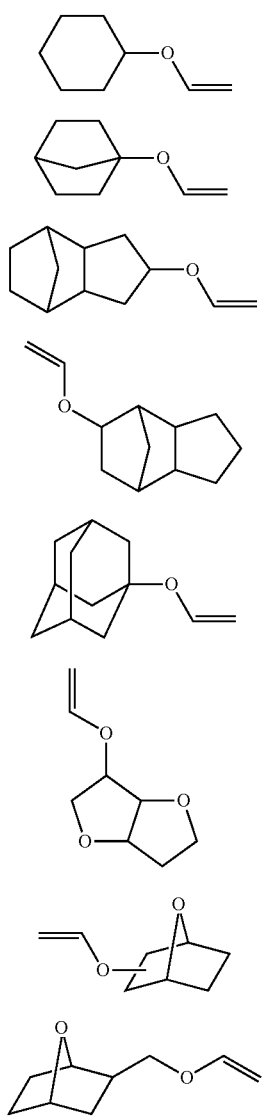

(3l)
(3m)
(3n)
(3o)
(3p)
(3q)
(3r)
(3s)

In particular, the compounds represented by General Formula (3) are preferably selected from compounds containing an alicyclic hydrocarbon group and/or a heterocyclic group (either one or both of an alicyclic hydrocarbon group and a heterocyclic group), such as the compound represented by Formula (31), the compound represented by Formula (3q), the compound represented by Formula (3r), and the compound represented by Formula (3s). These compounds are preferred for easily giving hyperbranched polymers that have photoreactivity, solubility in organic solvents, and resistance to developers and water at more excellent levels.

The compounds represented by General Formula (3) can each be produced by a well-known, common method without limitation, but may be produced typically by a method similar to that for the compound represented by General Formula (2). The compounds represented by General Formula (3) may also be available as commercial products.

The monofunctional compound for use herein may also include one or more compounds other than the compounds represented by General Formula (3).

Hyperbranched Polymer Production

As described above, the hyperbranched polymer according to the present invention is obtained by subjecting the monomer (X) and the monomer (Y) to a reaction (addition polymerization). Specifically, the hyperbranched polymer according to the present invention can be produced by a production method that includes, as an essential step, the step of reacting (addition-polymerizing) the monomer (X) with the monomer (Y). This method is hereinafter also referred to as a "method for producing the hyperbranched polymer according to the present invention". In the step, the monomer (X) to be used includes at least one compound selected from the group consisting of cyclodextrins, the compounds represented by General Formula (I), pillararenes, the compounds represented by General Formula (II), the compounds represented by General Formula (III), and the compounds represented by General Formula (IV); and the monomer (Y) to be used includes the compound represented by General Formula (1). The step may also be performed further using (reacting) another monomer such as the monofunctional compound (in particular, the compound represented by General Formula (3)), in addition to the monomer (X) and the monomer (Y), as described above. The monofunctional compound may be reacted simultaneously with the reaction between the monomer (X) and the monomer (Y), or may be reacted after the reaction between the monomer (X) and the monomer (Y).

The amounts of the monomer (X) and the monomer (Y) to be subjected to the addition polymerization are not limited. However, the control typically of the ratio between the amounts of these monomers enables the control of the structure of the terminal groups (such as the amount of hydroxy groups remained in the hyperbranched polymer) of the resulting hyperbranched polymer according to the present invention. The blending ratio of the monomer (X) to the monomer (Y) is not limited, but the amount of the monomer (X) in terms of functional group equivalent is preferably 0.5 to 3.0 times, more preferably 1.0 to 2.0 times, and furthermore preferably 1.1 to 1.7 times the amount of the monomer (Y). The monomer (X) and the monomer (Y), when used in a ratio (proportion) within the range, tend to allow the hyperbranched polymer to have solubility in organic solvents, and resistance to developers and water at still better levels.

The monomer (X) to be subjected to the addition polymerization may include the compound (A) in a proportion not limited, but preferably 80 weight percent or more (e.g., 80 to 100 weight percent), and more preferably 90 weight percent or more, of the total amount (100 weight percent) of the monomer (X). This configuration tends to readily give a hyperbranched polymer whose backbone is readily decomposable by an acid, and which has excellent surface smoothness and sensitivity.

The monomer (Y) to be subjected to the addition polymerization may include the compound (B) in a proportion not limited, but preferably 80 weight percent or more (e.g., 80 to 100 weight percent), and more preferably 90 weight percent or more, of the total amount (100 weight percent) of the monomer (Y). This configuration tends to readily give a hyperbranched polymer whose backbone is readily decomposable by an acid, and which has excellent surface smoothness and sensitivity.

The amount of the monofunctional compound (in particular, the compound represented by General Formula (3)) to be subjected to a reaction in addition to the monomer (X) and the monomer (Y) is not limited, but is preferably 5 to 75 parts by weight, more preferably 15 to 65 parts by weight, and furthermore preferably 40 to 55 parts by weight, per 100 parts by weight of the monomer (Y). The monofunctional compound (in particular, compound represented by General Formula (3)), when used in an amount controlled within the range, tends to allow the hyperbranched polymer to have still better resistance to developers (in particular, alkaline developers) and water.

The addition polymerization (reaction) may be performed using a polymerization catalyst so as to proceed more efficiently. Namely, the addition polymerization may proceed in the presence of a polymerization catalyst. The polymerization catalyst for use herein may be selected from known or common polymerization catalysts, is not limited, but is exemplified typically by acid catalysts and base catalysts. Preferred examples of the acid catalysts include sulfuric acid, hydrochloric acid, p-toluenesulfonic acid, pyridinium p-toluenesulfonate, and boron trifluoride. Each of different polymerization catalysts may be used alone or in combination.

In the addition polymerization, the polymerization catalyst may be used (added) in an amount not limited, but preferably 0.1 to 100 moles, and more preferably 1 to 50 moles, per 100 moles of the total amount of the monomer (X) and the monomer (Y). The polymerization catalyst, when used in an amount of 0.1 mole or more, tends to contribute to higher yield of the hyperbranched polymer. In contrast, the polymerization catalyst, when used in an amount of 100 moles or less, tends to offer more advantages in cost and in removal of the polymerization catalyst.

The addition polymerization may proceed in the presence of, or in the absence of, a solvent (polymerization solvent). In particular, the addition polymerization preferably proceeds in the presence of a solvent. This is preferred for uniform proceeding of the reaction. The solvent for use herein may be selected from known or common solvents, is not limited, but is exemplified typically by aromatic hydrocarbons such as benzene, toluene, xylene, mesitylene, pseudocumene, tetramethylbenzene, hexamethylbenzene, ethylbenzene, ethyltoluene, propylbenzene, ethylxylene, diethylxylene, propyltoluene, monochlorobenzene, dichlorobenzene, monofluorobenzene, difluorobenzene, monobromobenzene, dibromobenzene, and nitrobenzene; aliphatic hydrocarbons such as pentane, hexane, heptane, octane, cyclopentane, cyclohexane, methylcyclohexane, and decalin; halogenated hydrocarbons such as methyl chloride, methylene chloride, 1,2-dichloroethane, 1,1,1-trichloroethane, 1,1,2-trichloroethane, 1,1,2-trichloroethylene, 1-chlorobutane, and chloroform; nitriles such as acetonitrile and propionitrile; ethers such as tetrahydrofuran, ethylene glycol dimethyl ether, diethylene glycol dimethyl ether, propylene glycol dimethyl ether, dipropylene glycol dimethyl ether, ethylene glycol monomethyl ether, diethylene glycol monomethyl ether, propylene glycol monomethyl ether, and dipropylene glycol monomethyl ether; and aprotic polar solvents such as dimethyl sulfoxide, N-methylpyrrolidone, dimethylformamide, and N,N-dimethylacetamide. Among them, the solvent is preferably selected from aprotic polar solvents, and is more preferably dimethyl sulfoxide, for easily giving hyperbranched polymers that have excellent solubility in organic solvents. Each of different solvents may be used alone or in combination (typically as a solvent mixture).

The solvent may be used in an amount not limited, but preferably 10 to 5000 parts by weight, and more preferably 100 to 2000 parts by weight, per 100 parts by weight of the total amount of the monomer (X) and the monomer (Y). The range is preferred from the viewpoint of solubility of the monomers, the polymerization catalyst, and a product.

The temperature (polymerization temperature) in the addition polymerization can be selected as appropriate from well-known, common polymerization temperatures, is not limited, but is preferably 0° C. to 100° C., more preferably 0° C. to 60° C., and furthermore preferably 10° C. to 40° C. The time (polymerization time) for the addition reaction is not limited, but is preferably 1 to 72 hours, more preferably 1.5 to 24 hours, and furthermore preferably 2 to 6 hours.

The atmosphere in which the addition polymerization is performed is not limited and may be any atmosphere such as an air atmosphere or an inert gas atmosphere.

After the step of reacting the monomers, the method for producing the hyperbranched polymer according to the present invention may further include the step of purifying the resulting hyperbranched polymer. A process (means) to be applied for purifying the hyperbranched polymer is not limited, but may be selected from known or common processes exemplified typically by purification processes such as rinsing with water, alkali washing, filtration, concentration, distillation, extraction, crystallization, recrystallization, reprecipitation, and column chromatography; and purification processes as any combination of them. The method for producing the hyperbranched polymer according to the present invention may further include one or more other steps (such as the step of recovering components such as unreacted raw materials and the solvent).

Examples of reaction formulae of the addition polymerization in the method for producing the hyperbranched polymer according to the present invention will be illustrated below. In these examples, the compound (A) to be used is selected from a cyclodextrin (CDN; α-cyclodextrin, β-cyclodextrin, or γ-cyclodextrin) or a calixarene (CRA[4]; resorcinol[4]arene (specifically, calix[4]resorcarene)), and the compound (B) to be used is 1,4-divinyloxycyclohexane (DICH). However, the structures of the hyperbranched polymers illustrated in the reaction formulae are illustrated only schematically, and are not always illustrated as precise structures.

[Chem. 36]
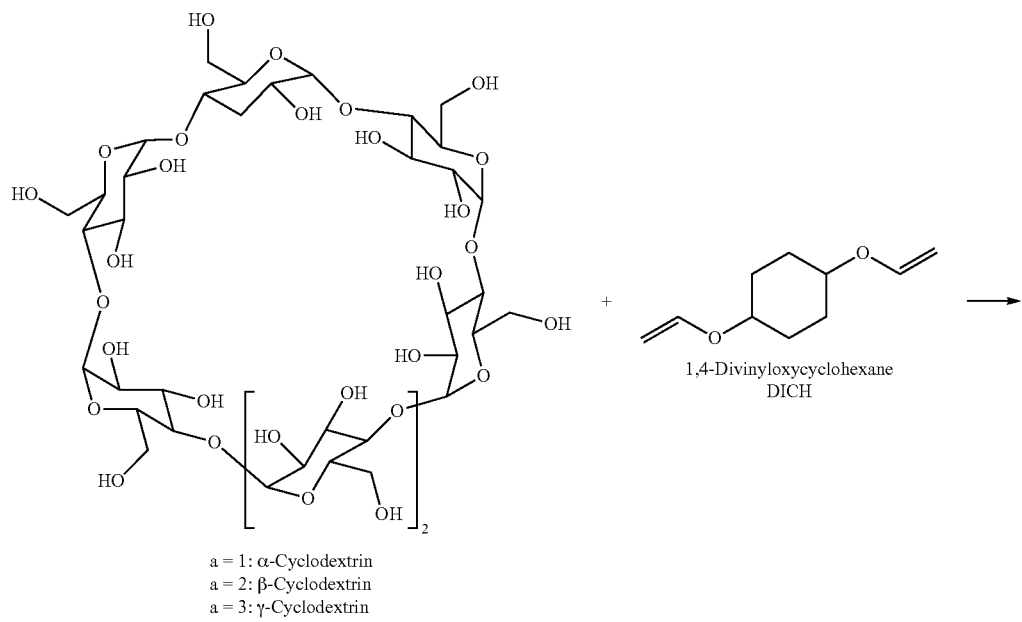
a = 1: α-Cyclodextrin
a = 2: β-Cyclodextrin
a = 3: γ-Cyclodextrin
1,4-Divinyloxycyclohexane
DICH
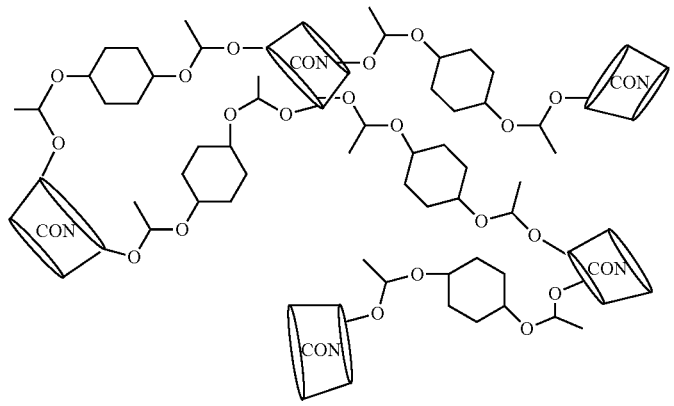
Hyperbranched Polymer
[Chem. 37]
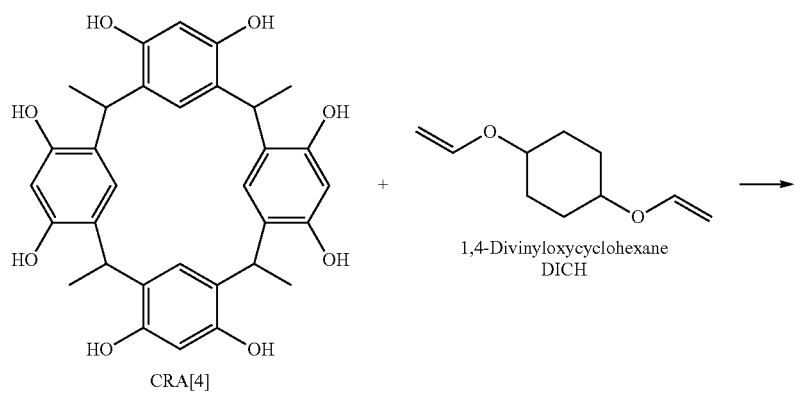
CRA[4]
1,4-Divinyloxycyclohexane
DICH

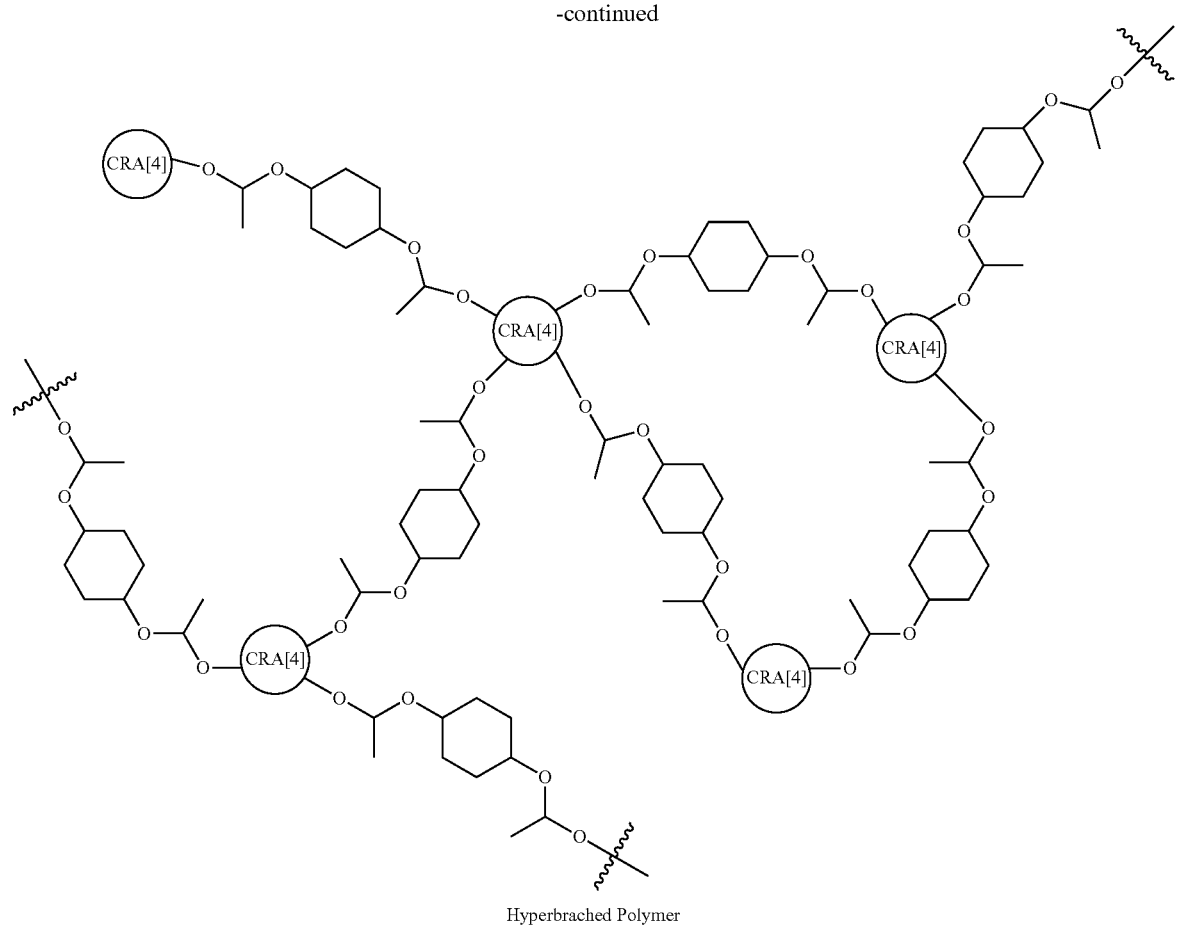

Hyperbrached Polymer

The hyperbranched polymer according to the present invention may have a number-average molecular weight (Mn) not limited, but preferably 2000 to 20000, more preferably 2500 to 10000, and furthermore preferably 3000 to 4000. The hyperbranched polymer according to the present invention may have a molecular-weight dispersity (Mw/Mn) not limited, but preferably 1.10 to 10, more preferably 1.15 to 5, and furthermore preferably 1.17 to 2. The number-average molecular weight and the molecular-weight dispersity of the hyperbranched polymer according to the present invention are values calculated from molecular weights as measured by gel permeation chromatography (GPC) and calibrated with a polystyrene standard. The hyperbranched polymer, if having a number-average molecular weight of greater than 20000, may have inferior solubility in organic solvents and/or inferior optical transparency, thus being undesirable. In contrast, the hyperbranched polymer, if having a number-average molecular weight of less than 2000, may be unsuitable as a resist material because of giving a coating having lower strength. The hyperbranched polymer, when having a molecular-weight dispersity controlled within the range (in particular, controlled to 10 or less), tends to be easily controlled in quality and to be effectively stably produced.

The hyperbranched polymers according to the present invention may be used in a variety of applications such as coating materials, inks, adhesives, resin fillers, various molding materials, agents for forming nanometer-size pores, chemical mechanical abrasives, supporting materials for functional substances, nanocapsules, photonic crystals, resist materials (such as photoresist materials), optical materials, printing materials, medical materials, and magnetic materials. The hyperbranched polymers may also be used in the form of compositions in combination with one or more other components, according to the intended use.

Composition

The hyperbranched polymer according to the present invention contains acetal groups in its backbone as described above, and allows the backbone to be readily decomposed by the action of an acid. On the other hand, the hyperbranched polymer according to the present invention is a polymer that is stable to alkalis. Accordingly, a composition typically including the hyperbranched polymer according to the present invention, a photoacid generator, and an organic solvent as essential components (this composition is also referred to as a "composition according to the present invention") is preferably usable as a photosensitive resin composition. In particular, the composition according to the present invention is preferably usable as a photosensitive resin composition for photoresist use. In other words, the composition according to the present invention (photosensitive resin composition), when cured, can give a cured product, and the cured product forms a fine pattern.

The composition according to the present invention may include each of different hyperbranched polymers according to the present invention alone or in combination.

The composition according to the present invention may contain the hyperbranched polymer(s) according to the present invention in a content (proportion) not limited, but preferably 0.1 to 70 weight percent, more preferably 1 to 50 weight percent, and furthermore preferably 3 to 30 weight percent, of the total amount (100 weight percent) of the composition.

Photoacid Generator

The photoacid generator for use in the composition according to the present invention may be selected from known or common photoacid generators and is not limited. Non-limiting examples of the photoacid generator include well-known, common compounds that generate an acid efficiently by the irradiation with light (by exposure), including diazonium salts, iodonium salts (such as diphenyliodonium hexafluorophosphate), sulfonium salts (such as triphenylsulfonium hexafluoroantimonate, triphenylsulfonium hexafluorophosphate, and triphenylsulfonium methanesulfonate), sulfonic acid esters (such as 1-phenyl-1-(4-methylphenyl)sulfonyloxy-1-benzoylmethane, 1,2,3-trisulfonyloxymethylbenzene, 1,3-dinitro-2-(4-phenylsulfonyloxymethyl)benzene, and 1-phenyl-1-(4-methylphenylsulfonyloxymethyl)-1-hydroxy-1-benzoylmethane), oxathiazole derivatives, s-triazine derivatives, disulfone derivatives (such as diphenyl disulfone), imide compounds, oxime sulfonates, diazonaphthoquinone, and benzoin tosylate.

The composition according to the present invention may include each of different photoacid generators alone or in combination.

The content (proportion) of the photoacid generator(s) in the composition according to the present invention is not limited and may be selected as appropriate according typically to the strength of the acid to be generated by light irradiation and the proportions of monomer units (constitutional repeating units) in the hyperbranched polymer. For example, the content is preferably 0.1 to 30 parts by weigh, more preferably 0.5 to 25 parts by weight, and furthermore preferably 1 to 20 parts by weight, per 100 parts by weight of the hyperbranched polymer according to the present invention.

Organic Solvent (Resist Solvent)

The organic solvent for use in the composition according to the present invention may be selected from known or common organic solvents, is not limited, but is exemplified typically by the solvents exemplified as the polymerization solvent; as well as glycol solvents, ester solvents, ketone solvents, and solvent mixtures including them. In particular, the organic solvent is preferably selected from propylene glycol monomethyl ether, propylene glycol monomethyl ether acetate, ethyl lactate, methyl isobutyl ketone, methyl amyl ketone, cyclohexanone, and mixtures of them. The composition according to the present invention may include each of different organic solvents alone or in combination. The content (proportion) of the organic solvent(s) in the composition according to the present invention is not limited, and can be set as appropriate typically at such an amount that the content of the hyperbranched polymer according to the present invention falls within the preferred range.

In addition to the above-mentioned components, the composition according to the present invention may further include one or more other components. Non-limiting examples of such other components include alkali-soluble components such as alkali-soluble resins (such as novolac resins, phenol resins, imide resins, and carboxy-containing resins); and colorants (such as dyes). The contents (proportions) of the other components are not limited and can be set and selected as appropriate from well-known, common amounts.

The composition according to the present invention can be obtained by blending and mixing components to constitute the composition according to a known or common method. For example, the composition according to the present invention may be obtained by a method in which the hyperbranched polymer according to the present invention is dissolved in an organic solvent (resist solvent) to give a solution (photoresist polymer solution), and the solution is combined with a photoacid generator.

Assume that the composition according to the present invention is used as a photosensitive resin composition. In this case, patterning (pattern formation) can be performed typically by applying the composition onto a base material or substrate, curing the applied composition, and performing development. More specifically, a fine pattern with high precision can be formed typically in the following manner. The composition according to the present invention (photosensitive resin composition) is applied onto a base material or substrate and dried to form a coating (resist film). The coating is cured (typically via exposure) through a predetermined mask (and, as needed, further baked after the exposure) to form a latent image pattern. Next, the latent image pattern is developed to form the fine pattern.

The base material or substrate for use herein can be selected from known or common base materials and substrates, is not limited, but is exemplified typically by silicon wafers, metal base materials (substrates), plastic base materials (substrates), glass base materials (substrates), and ceramic base materials (substrates). The application (coating) of the composition according to the present invention (photosensitive resin composition) may be performed using any of common coating devices such as spin coaters, dip coaters, and roll coaters. The coating may have a thickness not limited, but preferably 0.01 to 20 μm, and more preferably 0.02 to 2 μm.

For exposure of the coating, light rays at various wavelengths (such as ultraviolet rays and X rays) can be used without limitation. Non-limiting examples of light rays generally usable for semiconductor resists include g line, i line, excimer laser (such as XeCl, KrF, KrCl, ArF, and ArCl laser), and extreme ultraviolet rays (EUV). The composition according to the present invention (resist composition, lithography composition) is particularly suitable for exposure to far-ultraviolet rays at wavelengths of 220 nm or less. The exposure may be performed at energy not limited, but preferably 1 to 1000 mJ/cm$^2$, and more preferably 2 to 100 mJ/cm$^2$.

The light application (exposure) to the coating allows the photoacid generator in the coating to generate an acid, and the acid cleaves the acetal groups in the backbone of the hyperbranched polymer according to the present invention. The polymer chain in the exposed portion is thereby decomposed into low-molecular-weight chains. Thus, the resulting coating, when subjected to development using water or a developer (in particular, an alkaline developer), forms a predetermined pattern precisely. The hyperbranched polymer according to the present invention is, as described above, a material that offers solubility in developers not by side chain degradation, but by backbone decomposition. The hyperbranched polymer therefore offers excellent surface smoothness after development and has good sensitivity upon the use of low-power light sources. This allows the composition including the hyperbranched polymer according to the present invention as an essential component to be useful as resist materials (in particular, photoresist materials) and to offer resolution, LWR, and sensitivity at excellent levels.

The patterning in the step enables highly precise and highly efficient semiconductor production.

EXAMPLES

The present invention will be illustrated in further detail with reference to several examples below. It should be noted, however, that the examples are by no means intended to limit the scope of the present invention.

Example 1

In an eggplant flask, 4.54 g (4 mmol) of β-cyclodextrin (β-CD), 4 mL (such an amount as to give a β-CD concentration of 1 M) of dimethyl sulfoxide solvent, 7.06 g (42 mmol) of 1,4-divinyloxycyclohexane (DICH), and 2.65 g (21 mmol) of cyclohexyl vinyl ether (CVE) were placed, followed by stirring. After the completion of stirring, 0.31 g (1.26 mmol) of pyridinium p-toluenesulfonate as a catalyst was added, followed by a reaction at room temperature for 2 hours.

[Chem. 38]

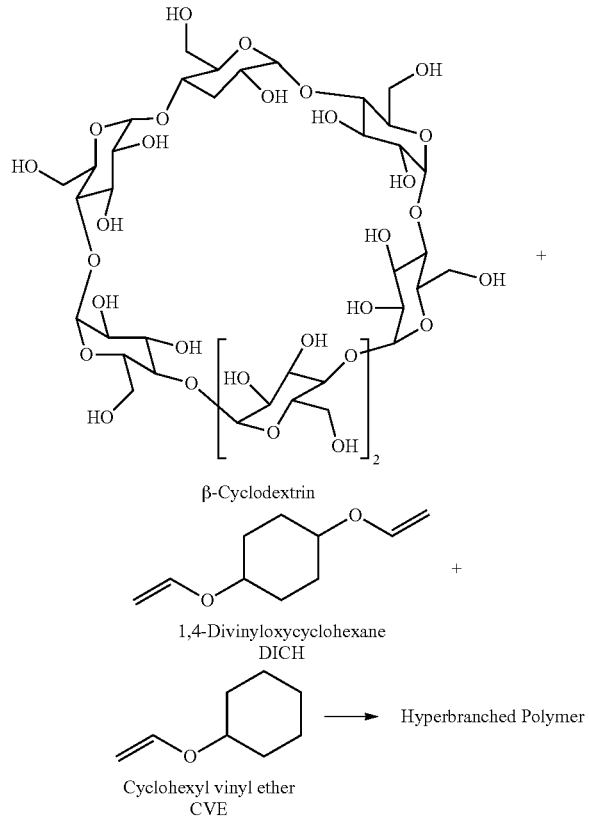

β-Cyclodextrin 1,4-Divinyloxycyclohexane
DICH

Cyclohexyl vinyl ether
CVE

→ Hyperbranched Polymer

After the completion of reaction, the reaction mixture was quenched with triethylamine and subjected to reprecipitation using dimethyl sulfoxide as a good solvent, and water as a poor solvent. The resulting solid was separated by filtration, dried at 60° C. under reduced pressure, and yielded a hyperbranched polymer (poly(β-CD-co-DICH-co-CVE)) recovered as a white solid (in a yield in amount of 11.5 g and a yield in percentage of 80%).

The molecular weights of the resulting hyperbranched polymer were measured by size exclusion chromatography (GPC; using, as an eluent, DMF containing LiBr and $H_3PO_4$ and were calibrated with a polystyrene standard. On the basis of these, the average molecular weights of the hyperbranched polymer were calculated to find that the hyperbranched polymer had a number-average molecular weight (Mn) of 4400, a weight-average molecular weight (Mw) of 8100, and a molecular-weight dispersity (Mw/Mn) of 1.83.

In addition, the FT-IR spectrum and $^1$H-NMR spectrum of the hyperbranched polymer were measured, and the results are illustrated respectively in FIG. 1 and FIG. 2. The hyperbranched polymer structurally has an acetal-group-containing backbone, as illustrated in FIG. 1 and FIG. 2. The backbone is therefore readily decomposable by an acid. For example, when the hyperbranched polymer is formulated with a photoacid generator into a composition, the composition is useable as a photosensitive resin composition.

In addition, about 2 mg of the above-obtained hyperbranched polymer were placed in 2 ml of a tetramethylammonium hydride (TMAH) aqueous solution (TMAH concentration: 2.38 weight percent) and left stand at 25° C. for 0.1 hour. Whether the hyperbranched polymer was dissolved was then visually observed to find that the hyperbranched polymer is insoluble in the TMAH aqueous solution.

Example 2

In a test tube, 1.2 mmol of α-cyclodextrin (α-CD) and 9.0 mmol of 1,4-divinyloxycyclohexane (DICH) were placed, and dimethyl sulfoxide was added so as to give a concentration (monomer concentration) of 1 M, followed by stirring for dissolution. The mole ratio of α-CD to DICH is 1.2:9.0 (α-CD:DICH). After checking dissolution of the monomers, pyridinium p-toluenesulfonate as a catalyst was added in such an amount as to have a concentration of 3 mole percent relative to α-CD, followed by a reaction at room temperature for 2 hours.

[Chem. 39]

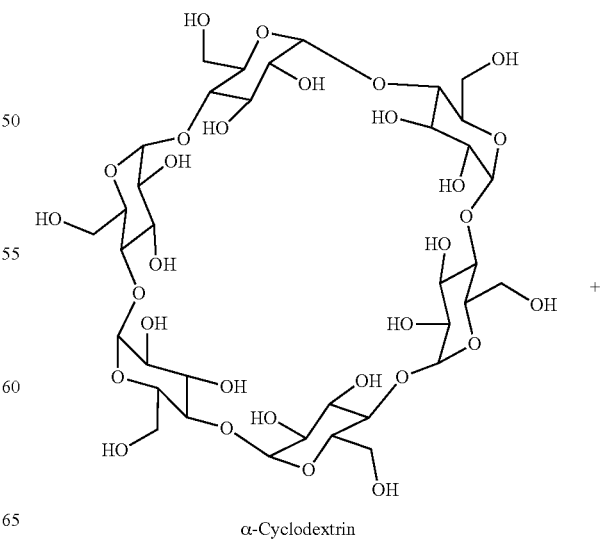

α-Cyclodextrin

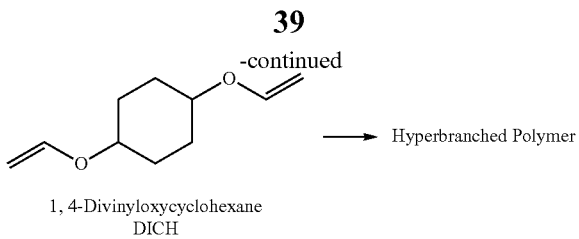

1,4-Divinyloxycyclohexane
DICH

→ Hyperbranched Polymer

After the completion of reaction, the reaction mixture was quenched with triethylamine and subjected to reprecipitation using dimethyl sulfoxide as a good solvent, and water as a poor solvent. The resulting solid was separated by filtration, dried at 60° C. under reduced pressure, and yielded a hyperbranched polymer (poly(α-CD-co-DICH)) recovered as a white solid (in a yield of 38%).

The average molecular weights of the resulting hyperbranched polymer were measured and calculated by a procedure similar to that in Example 1, to find that the hyperbranched polymer had a number-average molecular weight (Mn) of 16000, and a molecular-weight dispersity (Mw/Mn) of 2.29.

Decomposition of the above-obtained hyperbranched polymer (poly(α-CD-co-DICH)) by an acid was verified in the following procedure.

The hyperbranched polymer and a photoacid generator (trade name TPS-Nf (triphenylsulfonium perfluoro-1-butanesulfonate), supplied by Heraeus K.K.) were dissolved in propylene glycol monomethyl ether acetate (PGMEA) and yielded a solution (composition).

The solution was applied and filmed by casting onto an aluminum substrate to form a thin film. The thin film was irradiated with an ultraviolet ray while performing a measurement via RT-FTIR.

A comparison in the results of RT-FTIR measurement between before and after the ultraviolet irradiation demonstrated that, by the ultraviolet irradiation, an acetal-group-derived peak at around 1100 cm$^{-1}$ was decreased, and a hydroxy-group-derived peak (peak at around 3000 to 3700 cm$^{-1}$) assigned to α-cyclodextrin and 1,4-cyclohexanediol was increased. This clearly demonstrated that the above-obtained hyperbranched polymer (poly(α-CD-co-DICH)) undergoes an acetal group decomposition reaction by light irradiation (specifically, by acid generation via light irradiation). It is considered that the decomposition gives α-cyclodextrin, 1,4-cyclohexanediol, and acetaldehyde.

The primary reaction rate constant of the decomposition reaction by light irradiation was calculated from the decrease rate (rate of change) of the acetal-group-derived peak at around 1100 cm$^{-1}$ in the RT-FTIR spectrum. FIG. 3 depicts a graph with the ordinate indicating the intensity ratio of the acetal-group-derived peak in the RT-FTIR spectrum, and the abscissa indicating the time (second). The intensity ratio of the acetal-group-derived peak is indicated as "conversion (%)" for the sake of convenience (hereinafter the same) and is treated alike the acetal group concentration. Herein, the peak intensity before ultraviolet irradiation (0 second) was defined as 100, and the peak intensity upon ultraviolet irradiation for 120 minutes was defined as 0. FIG. 4 depicts a graph with the ordinate indicating –ln([Intensity of the acetal-group-derived peak at a time of t seconds (t seconds after the ultraviolet irradiation; hereinafter the same)]/[Intensity of the acetal-group-derived peak at a time of 0 second (before ultraviolet irradiation; hereinafter the same)]), and the abscissa indicating the time (second). On the basis of FIG. 4, the reaction rate constant (k) of the decomposition reaction by light irradiation was calculated and was found to be 1.4E-2 (k=1.4E-2). The results demonstrated that the above-obtained hyperbranched polymer offers good photodegradability (decomposability by the action of an acid generated via light irradiation).

The solubility of the hyperbranched polymer in a TMAH aqueous solution was examined by a procedure similar to that in Example 1. As a result, the hyperbranched polymer was found to have excellent resistance to (resist dissolution in) the TMAH aqueous solution.

Example 3

In a test tube, 1.0 mmol of β-cyclodextrin (β-CD) and 10.5 mmol of 1,4-divinyloxycyclohexane (DICH) were placed, and dimethyl sulfoxide was added so as to give a concentration (monomer concentration) of 1 M, followed by stirring for dissolution. The mole ratio of β-CD to DICH is 1.0:10.5 (β-CD:DICH). After checking the dissolution of the monomers, pyridinium p-toluenesulfonate as a catalyst was added in such an amount as to have a concentration of 3 mole percent relative to β-CD, followed by a reaction at room temperature for 2 hours.

[Chem. 40]

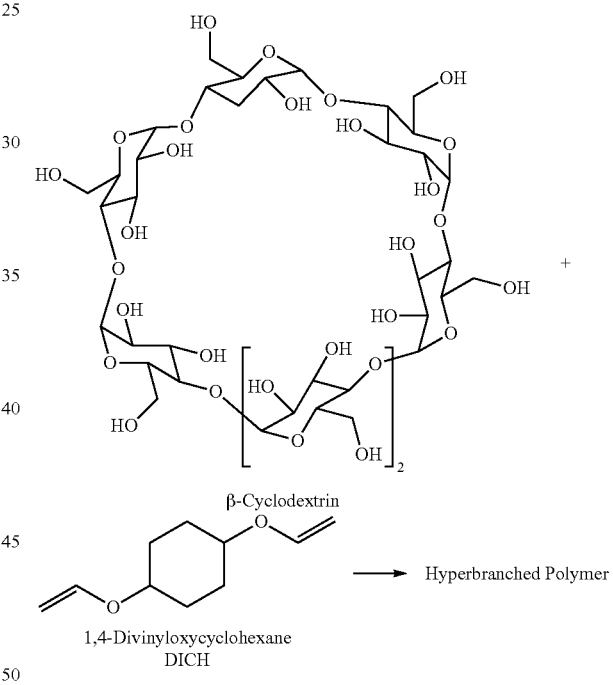

β-Cyclodextrin 1,4-Divinyloxycyclohexane
DICH

→ Hyperbranched Polymer

After the completion of reaction, the reaction mixture was quenched with triethylamine and subjected to reprecipitation using dimethyl sulfoxide as a good solvent, and water as a poor solvent. The resulting solid was separated by filtration, dried at 60° C. under reduced pressure, and yielded a hyperbranched polymer (poly(β-CD-co-DICH)) recovered as a white solid (in a yield of 11%).

The average molecular weights of the resulting hyperbranched polymer were measured and calculated by a procedure similar to that in Example 1, to find that the hyperbranched polymer had a number-average molecular weight (Mn) of 7200, and a molecular-weight dispersity (Mw/Mn) of 1.62.

Decomposition of the above-obtained hyperbranched polymer (poly(β-CD-co-DICH)) by an acid was verified according to a procedure as follows.

The hyperbranched polymer and a photoacid generator (trade name TPS-Nf, ibid.) were dissolved in propylene glycol monomethyl ether acetate (PGMEA) and yielded a solution (composition).

The solution was applied and filmed by casting onto an aluminum substrate to form a thin film. The thin film was irradiated with an ultraviolet ray while performing a measurement via RT-FTIR.

A comparison in the results of RT-FTIR measurement between before and after the ultraviolet irradiation demonstrated that, by the ultraviolet irradiation, an acetal-group-derived peak at around 1100 cm$^{-1}$ was decreased, and a hydroxy-group-derived peak (peak at around 3000 to 3700 cm$^{-1}$) assigned to β-cyclodextrin and 1,4-cyclohexanediol was increased. This clearly demonstrated that the above-obtained hyperbranched polymer (poly(β-CD-co-DICH)) undergoes an acetal group decomposition reaction by light irradiation (specifically, by acid generation via light irradiation). It is considered that the decomposition gives β-cyclodextrin, 1,4-cyclohexanediol, and acetaldehyde.

The primary reaction rate constant of the decomposition reaction by light irradiation was calculated from the decrease rate (rate of change) of the acetal-group-derived peak at around 1100 cm$^{-1}$ in the RT-FTIR spectrum. FIG. 5 depicts a graph with the ordinate indicating the intensity ratio of the acetal-group-derived peak in the RT-FTIR spectrum, and the abscissa indicating the time (second). The intensity ratio of the acetal-group-derived peak is treated alike the acetal group concentration. Herein, the peak intensity before ultraviolet irradiation (0 second) was defined as 100, and the peak intensity upon ultraviolet irradiation for 120 minutes was defined as 0. FIG. 6 depicts a graph with the ordinate indicating −ln([Intensity of the acetal-group-derived peak at a time of t seconds]/[Intensity of the acetal-group-derived peak at a time of 0 second]), and the abscissa indicating the time (second). On the basis of FIG. 6, the reaction rate constant (k) of the decomposition reaction by light irradiation was calculated and was found to be 4.5E-2. These results demonstrated that the above-obtained hyperbranched polymer offers good photodegradability (decomposability by the action of an acid generated via light irradiation).

The solubility of the hyperbranched polymer in a TMAH aqueous solution was examined by a procedure similar to that in Example 1. As a result, the hyperbranched polymer was found to have excellent resistance to (resist dissolution in) the TMAH aqueous solution.

Example 4

In an eggplant flask, 15 mmol of a resorcinarene (calix[4]resorcarene) (CAR[4]) and 1.34 g (75 mmol) of 1,4-divinyloxycyclohexane (DICH) were placed, and dimethyl sulfoxide was added so as to give a concentration (monomer concentration) of 1.25 M, followed by stirring for dissolution. After the completion of stirring, 1.13 g (4.5 mmol) of pyridinium p-toluenesulfonate as a catalyst were added, followed by a reaction at room temperature for 5 hours.

[Chem. 41]

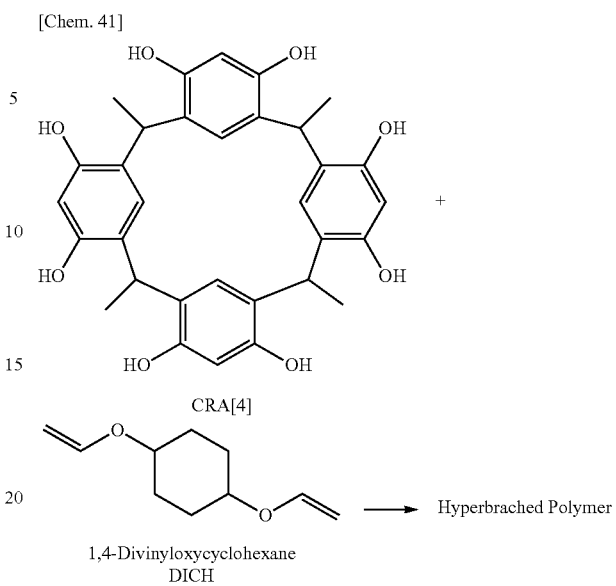

CRA[4]

1,4-Divinyloxycyclohexane
DICH

→ Hyperbrached Polymer

After the completion of reaction, the reaction mixture was quenched with triethylamine and subjected to reprecipitation using dimethyl sulfoxide as a good solvent, and a triethylamine aqueous solution as a poor solvent. The resulting solid was separated by filtration, dried at 60° C. under reduced pressure, and yielded a hyperbranched polymer (poly(CAR[4]-co-DICH)) recovered as a solid (in a yield in amount of 16.85 g and a yield in percentage of 74%).

The average molecular weights of the resulting hyperbranched polymer were measured and calculated by a procedure similar to that in Example 1, to find that the hyperbranched polymer had a number-average molecular weight (Mn) of 3900, a weight-average molecular weight (Mw) of 4800, and a molecular-weight dispersity (Mw/Mn) of 1.23.

In addition, the FT-IR spectrum and $^1$H-NMR spectrum of the hyperbranched polymer were measured, and the results are illustrated respectively in FIG. 7 and FIG. 8. The hyperbranched polymer is a polymer having a structure including an acetal-group-containing backbone, as illustrated in FIG. 7 and FIG. 8.

Decomposition of the above-obtained hyperbranched polymer (poly(CAR[4]-co-DICH)) by an acid was verified according to a procedure as follows.

The hyperbranched polymer and a photoacid generator (trade name TPS-Nf, ibid.) were dissolved in propylene glycol monomethyl ether acetate (PGMEA) and yielded a solution (composition).

The solution was applied and filmed by casting onto an aluminum substrate to form a thin film. The thin film was irradiated with an ultraviolet ray while performing a measurement via RT-FTIR.

A comparison in the results of RT-FTIR measurement between before and after the ultraviolet irradiation demonstrated that, by the ultraviolet irradiation, an acetal-group-derived peak at around 1100 cm$^{-1}$ was decreased, and a hydroxy-group-derived peak (peak at around 3000 to 3700 cm$^{-1}$) assigned to the resorcinarene (calix[4]resorcarene) and 1,4-cyclohexanediol was increased. This clearly demonstrated that the above-obtained hyperbranched polymer (poly(CAR[4]-co-DICH)) undergoes an acetal group decomposition reaction by light irradiation (specifically, by acid generation via light irradiation). It is considered that the decomposition gives CAR[4], 1,4-cyclohexanediol, and acetaldehyde.

The primary reaction rate constant of the decomposition reaction by light irradiation was calculated from the decrease rate (rate of change) of the acetal-group-derived peak at around 1100 cm$^{-1}$ in the RT-FTIR spectrum. FIG. 9 depicts a graph with the ordinate indicating the intensity ratio of the acetal-group-derived peak in the RT-FTIR spectrum, and the abscissa indicating the time (second). The intensity ratio of the acetal-group-derived peak is treated alike the acetal group concentration. Herein, the peak intensity before ultraviolet irradiation (0 second) was defined as 100, and the peak intensity upon ultraviolet irradiation for 120 minutes was defined as 0. FIG. 10 depicts a graph with the ordinate indicating −ln([Intensity of the acetal-group-derived peak at a time of t seconds]/[Intensity of the acetal-group-derived peak at a time of 0 second]), and the abscissa indicating the time (second). On the basis of FIG. 10, the reaction rate constant (k) of the decomposition reaction by light irradiation was calculated and was found to be 1.1E-1. These results demonstrated that the above-obtained hyperbranched polymer offers good photodegradability (decomposability by the action of an acid generated via light irradiation).

Production Example 1

In an eggplant flask, 1.10 g (10 mmol) of resorcinol, 10 mL of ethanol as a solvent, and 1.5 mL of hydrochloric acid as a catalyst were placed, followed by stirring with ice-cooling. Then 1.68 g (10 mmol) of 4-tert-butylbenzaldehyde were added dropwise thereto. Next, the resulting solution was heated in an oil bath and was found to change to brown. From this time point, the solution was stirred at 80° C. for 20 minutes, and the reaction was ended. After the completion of reaction, the reaction mixture was cooled down to room temperature, and a precipitated solid was separated by filtration. This was washed with water and with methanol and yielded C$_4$-tert-butylphenylcalix[4]resorcarene represented by the following formula as a white solid (in a yield in amount of 1.64 g and a yield in percentage of 59%).

[Chem. 42]

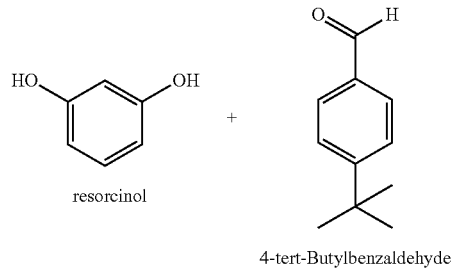

resorcinol 4-tert-Butylbenzaldehyde

-continued

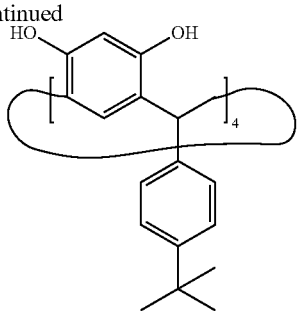

tert-Butyl phenyl CRA[4]
BP-CRA[4]

The average molecular weights of the resulting C$_4$-tert-butylphenylcalix[4]resorcarene were measured and calculated by a procedure similar to that in Example 1, to find that this compound had a number-average molecular weight (Mn) of 1200, a weight-average molecular weight (Mw) of 1290, and a molecular-weight dispersity (Mw/Mn) of 1.01.

In addition, the $^1$H-NMR spectrum of the C$_4$-tert-butylphenylcalix[4]resorcarene was measured. The result is illustrated in FIG. 11.

Example 5

In a flask, 0.8 mmol of C$_4$-tert-butylphenylcalix[4]resorcarene (t-butylphenyl-CRA[4]) obtained in Production Example 1, and acetonitrile (in such an amount as to give a monomer concentration of 0.5 M) were placed, followed by stirring. Next, 4.0 mmol of 1,4-divinyloxycyclohexane (DICH) and pyridinium p-toluenesulfonate catalyst (in such an amount as to be 3 mole percent relative to t-butylphenyl-CRA[4]), followed by a reaction at 70° C. for 24 hours.

[Chem. 43]

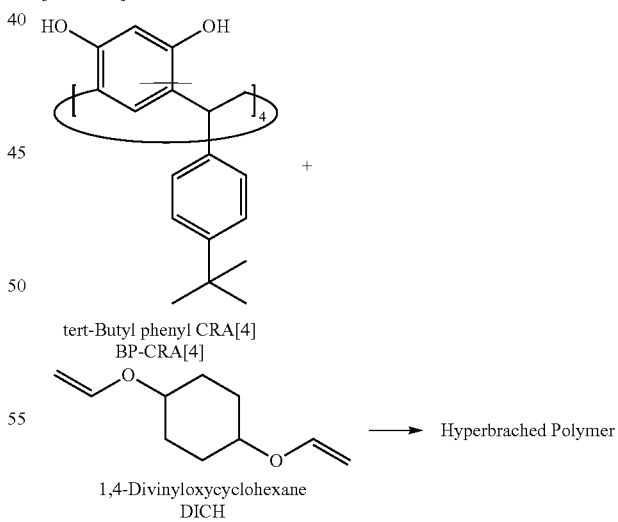

After the completion of reaction, the reaction mixture was quenched with triethylamine and subjected to reprecipitation. The resulting hyperbranched polymer (poly(t-butylphenyl-CRA[4]-co-DICH)) was recovered as a solid (in a yield of 61%).

The average molecular weights of the resulting hyperbranched polymer were measured and calculated by a procedure similar to that in Example 1, to find that the hyperbranched polymer had a number-average molecular weight (Mn) of 3600, a weight-average molecular weight (Mw) of 4700, and a molecular-weight dispersity (Mw/Mn) of 1.28.

In addition, the $^1$H-NMR spectrum of the prepared hyperbranched polymer was measurement. The result is illustrated in FIG. 12.

Sensitivity Evaluation

The hyperbranched polymer (poly(CAR[4]-co-DICH)), a photoacid generator (trade name TPS-Nf), and trioctylamine were dissolved in propylene glycol monomethyl ether acetate (PGMEA) so as to give a total amount of these components of 5 weight percent and yielded a solution (composition). The weight ratio in content of the hyperbranched polymer to the photoacid generator to trioctylamine was 100:10:1.25. This composition was applied using a spin coater to form a thin film. After performing exposure, development, and rinsing on the thin film, the amount (%) of the residual thin film was measured, and a sensitivity curve was plotted as illustrated in FIG. 13. The film formation conditions and development conditions are given below. The amount (%) of the residual thin film was calculated by the expression: (Film thickness after treatment)/(Film thickness upon film formation)×100.

Film Formation Conditions

Number of revolutions: 2000 rpm, time: 20 seconds, prebaking time: 90° C., post-baking time: 90° C., film thickness: 69.2 nm Development Conditions In the development, the work was developed for 30 seconds with a 2.38 weight percent tetramethylammonium hydroxide solution (TMAH solution) and then rinsed with ultrapure water for 15 seconds.

As a result, the hyperbranched polymer was found to have high sensitivity in terms of $E_0$ of 1.20 mJ/cm$^2$ and to provide good pattern contrast in terms of gamma value (γ) of 3.95.

Substrate Adhesion Evaluation

A thin film controlled to have a thickness of 50 nm to 100 nm was prepared by a procedure similar to that in the sensitivity evaluation. The thin film was immersed in a TMAH solution for 30 second to be developed. After development, the film thickness was measured and compared with the film thickness before development to measure film thinning. As a result, the hyperbranched polymer (poly (CAR[4]-co-DICH)) was found to have a film thinning of 3.8%. This indicated that the thin film has good adhesion with the substrate.

An operation similar to above was performed, except for using, instead of the hyperbranched polymer (poly(CAR[4]-co-DICH)), a linear polymer represented by following formula and obtained by an addition polymerization reaction of 2,2-bis(4-hydroxyphenyl)propane with 1,4-divinyloxycyclohexane; and the decrease of film thickness (nm) was evaluated. As a result, the thin film was found to have a very large decrease of film thickness of −72.5%.

[Chem. 44]

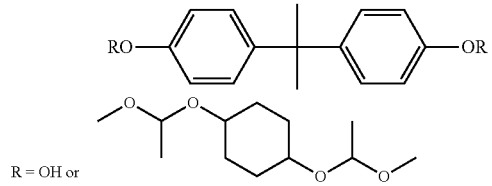

R = OH or

From the results, it is understood that hyperbranched polymers such as the hyperbranched polymer (poly(CAR [4]-co-DICH)) each have a structure with branches in a larger number and thereby offer higher adhesion to substrates, as compared with linear polymers. This demonstrated that the hyperbranched polymers according to the present invention have such molecular frames as to be useful as resist materials.

Etch Resistance Evaluation 1

The hyperbranched polymer (poly(CAR[4]-co-DICH)) was dissolved to a total amount (content) of 15 weight percent in propylene glycol monomethyl ether acetate (PG-MEA) and yielded a solution (composition). This solution was applied onto a silicon (Si) substrate and formed a thin film having a film thickness of 187 nm using the Mikasa Spin Coater. The resulting article was etched and evaluated using the RIE-10NOU Etching Machine supplied by SAMCO Inc. at room temperature and at a CF$_4$ flow rate of 15 (sccm), an Ar flow rate of 5 (sccm), and a process pressure of 1.0 Pa. The film thickness was measured at eight etching time points at intervals of 15 seconds, on the basis of which a decrease of film thickness (nm) was plotted, and the etching rate was calculated. As a result, the etching rate (nm/s) was found to be 90. The result is illustrated in FIG. 14.

Etch Resistance Evaluation 2

In 4.51 g of PGMEA, 0.48 g of the hyperbranched polymer (poly(CAR[4]-co-DICH)) was dissolved, and the resulting solution was further combined with 0.26 g of 10 weight percent triphenylsulfonium nonaflate and 0.5 g of 1 weight percent trioctylamine and yielded a solution (composition). This solution (composition) had a hyperbranched polymer (poly(CAR[4]-co-DICH)) concentration of 8.4 weight percent. Separately, 1 ml of 1,1,1,3,3,3-hexamethyldisilazane (HMDS) was added dropwise onto a silicon substrate, spin-coated thereon at 3300 revolutions per second (rps) for 60 seconds, and heated at 90° C. for 90 seconds. The solution (composition) was applied to the silicon substrate after the surface treatment, spin-coated thereon at 2800 rps for 60 second, and yielded a thin film having a film thickness of 108.1 nm.

The resulting article was then evaluated using the Beam Line 03 of NewSUBARU in the large synchrotron radiation facility SPring-8 at a CF$_4$ flow rate of 60 (sccm), an RF power of 100 (W), a Bias power of 25 (W), and at room temperature and a process pressure of 10 Pa. The film thickness was measured at four etching time points at intervals of 20 seconds, on the basis of which a decrease of film thickness (nm) was plotted and an etching rate was calculated. As a result, the etching rate (nm/s) was found to be 70.5. The result is illustrated in FIG. 15.

INDUSTRIAL APPLICABILITY

The hyperbranched polymer according to the present invention has the configuration and contains such a backbone that is readily decomposable by an acid. For example, assume that the hyperbranched polymer according to the present invention is used as a resist material (in particular, as a photoresist material). In this case, the backbone of the hyperbranched polymer can be readily decomposed by the action of an acid which is generated via a means such as application of light and/or heat. The hyperbranched polymer according to the present invention is such a material that can offer solubility in developers not by side chain degradation, but by backbone decomposition. The hyperbranched polymer therefore has excellent surface smoothness after development and offers good sensitivity even upon the use of low-power light sources. Thus, compositions including the hyperbranched polymer according to the present invention as an essential component are useful as resist materials (in particular, as photoresist materials) and offer resolution, LWR, and sensitivity at excellent levels.

The invention claimed is:
1. A hyperbranched polymer derived from, via reaction, monomers comprising:
   a monomer (X) containing three or more hydroxy groups per molecule; and
   a monomer (Y) containing two or more groups represented by General Formula (y) per molecule, General Formula (y) expressed as follows:

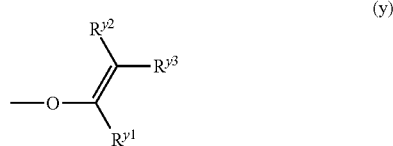

where $R^{y1}$ is selected from hydrogen and $C_1$-$C_{16}$ alkyl; and $R^{y2}$ and $R^{y3}$ are each, identically or differently, selected from hydrogen, alkyl, and cycloalkyl, where at least two of $R^{y1}$, $R^{y2}$, and $R^{y3}$ may be linked to each other to form a ring with adjacent one or two carbon atoms,
   the monomer (X) comprising at least one compound selected from the group consisting of:
   cyclodextrins;
   pillararenes;
   compounds represented by General Formula (II);
   compounds represented by General Formula (III); and
   compounds represented by General Formula (IV),
   the monomer (Y) comprising
   a compound represented by General Formula (1),
   General Formulae (II), (III), (IV), and (1) expressed as follows:

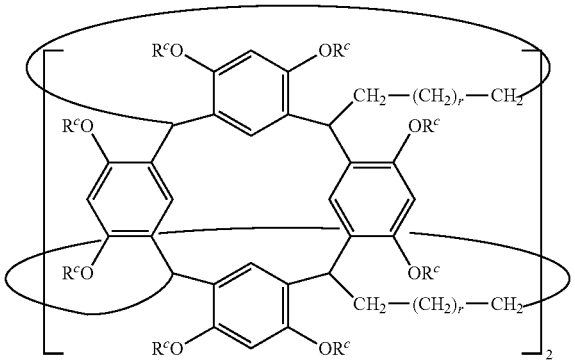

wherein $R^c$ is, identically or differently in each occurrence, selected from hydrogen and alkyl, where at least three occurrences of $R^c$ are hydrogen atoms; and r represents, independently in each occurrence, an integer of 1 to 4,

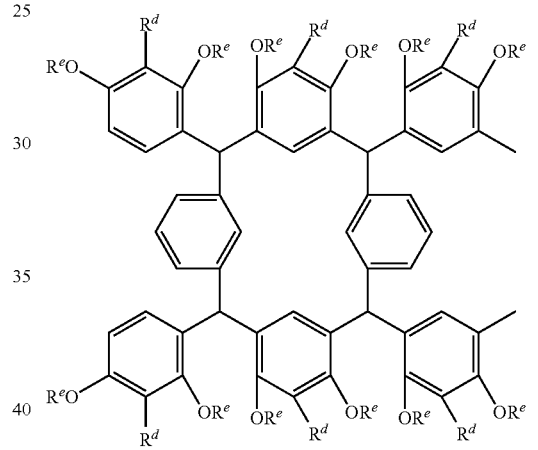

wherein $R^b$ is, identically or differently in each occurrence, selected from hydrogen and alkyl, where at least three occurrences of $R^b$ are hydrogen atoms,

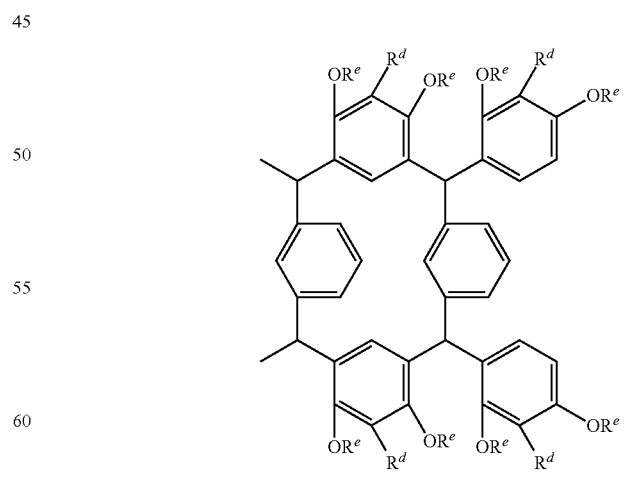

wherein $R^d$ represents, identically or differently in each occurrence, alkyl; and $R^e$ is, identically or differently in each occurrence, selected from hydrogen and alkyl, where at least three occurrences of $R^e$ are hydrogen atoms,

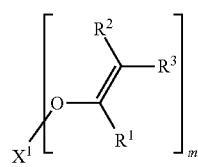

wherein $R^1$ is selected from hydrogen and $C_1$-$C_{16}$ alkyl; $R^2$ and $R^3$ are, identically or differently in each occurrence, selected from hydrogen, alkyl, and cycloalkyl, where at least two of $R^1$, $R^2$, and $R^3$ may be linked to each other to form a ring with adjacent one or two carbon atoms; $X^1$ represents an m-valent organic group; and m represents an integer of 2 or more, where occurrences of the group in the brackets with "m" may be identical to or different from each other.

2. The hyperbranched polymer according to claim 1, wherein the compounds represented by General Formula (1) are selected from compounds represented by General Formula (2):

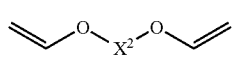

wherein $X^2$ is selected from:
  a divalent hydrocarbon group optionally having one or more occurrences of at least one substituent selected from the group consisting of hydroxy, alkoxys, carboxy, alkoxycarbonyls, acyls, aminos, sulfo, halogens, cyano, and nitro;
  a divalent heterocyclic group optionally having one or more of the substituents; and
  a divalent group comprising one or more hydrocarbon groups and one or more heterocyclic groups bonded to each other and optionally having one or more of the substituents.

3. The hyperbranched polymer according to claim 2, wherein $X^2$ in General Formula (2) is selected from:
  a divalent aliphatic hydrocarbon group;
  a divalent alicyclic hydrocarbon group;
  a divalent heterocyclic group; and
  a $C_4$-$C_{10}$ divalent group comprising two or more groups bonded to each other and selected from the group consisting of aliphatic hydrocarbon groups, alicyclic hydrocarbon groups, and heterocyclic groups.

4. The hyperbranched polymer according to claim 1, which has a number-average molecular weight of 2,000 to 20,000.

5. The hyperbranched polymer according to claim 1, wherein the monomers to constitute the hyperbranched polymer further comprise, in addition to the monomer (X) and monomer (Y), a compound represented by General Formula (3):

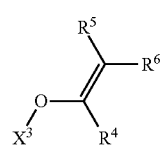

wherein $R^4$ is selected from hydrogen and $C_1$-$C_{16}$ alkyl; $R^5$ and $R^6$ are each, identically or differently, selected from hydrogen, alkyl, and cycloalkyl, where at least two of $R^4$, $R^5$, and $R^6$ may be linked to each other to form a ring with adjacent one or two carbon atoms; and $X^3$ represents a monovalent organic group devoid of groups represented by —O—$CR^4$=$CR^5R^6$.

6. A composition comprising:
  the hyperbranched polymer according to claim 1;
  a photoacid generator; and
  an organic solvent.

7. A photoresist, comprising:
  the composition according to claim 6.

8. A cured product of the composition according to claim 6.

9. A method for patterning, the method comprising:
  applying the composition according to claim 6 to a base material or substrate;
  curing the applied composition; and
  subjecting the cured composition to development.

10. A method for producing a hyperbranched polymer, the method comprising the step of:
  reacting monomers with each other, the monomers comprising:
    a monomer (X) containing three or more hydroxy groups per molecule; and
    a monomer (Y) containing two or more groups represented by General Formula (y) per molecule, General Formula (y) expressed as follows:

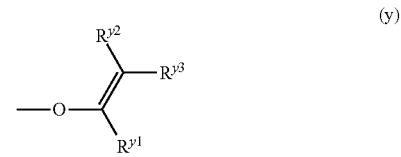

wherein $R^{y1}$ is selected from hydrogen and $C_1$-$C_{16}$ alkyl; and $R^{y2}$ and $R^{y3}$ are each, identically or differently, selected from hydrogen, alkyl, and cycloalkyl, where at least two of $R^{y1}$, $R^{y2}$, and $R^{y3}$ may be linked to each other to form a ring with adjacent one or two carbon atoms,
  the monomer (X) comprising at least one compound selected from the group consisting of:
    cyclodextrins;
    pillararenes;
    compounds represented by General Formula (II);
    compounds represented by General Formula (III); and
    compounds represented by General Formula (IV),
  the monomer (Y) comprising a compound represented by General Formula (1), General Formulae (II), (III), (IV), and (1) expressed as follows:

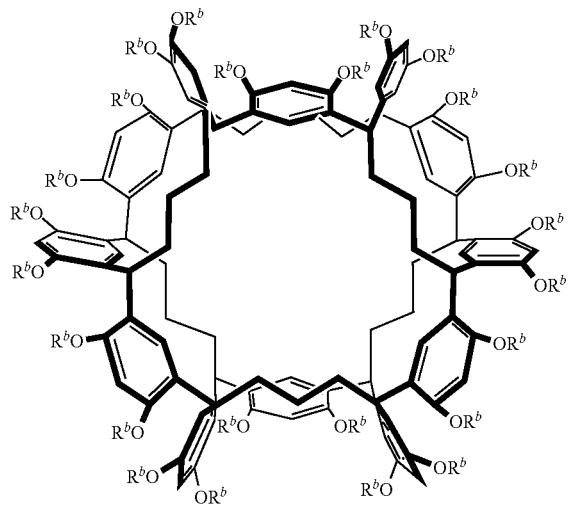

(II)

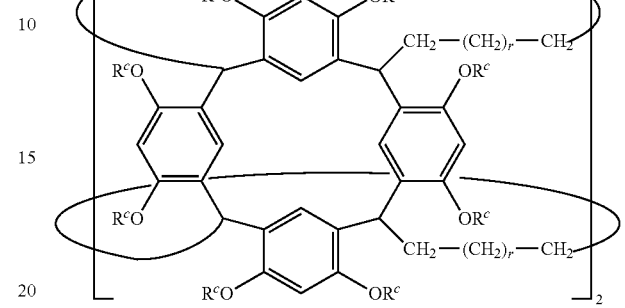

(III)

wherein $R^b$ is, identically or differently in each occurrence, selected from hydrogen and alkyl, where at least three occurrences of $R^b$ are hydrogen atoms, wherein $R^c$ is, identically or differently in each occurrence, selected from hydrogen and alkyl, where at least three occurrences of $R^c$ are hydrogen atoms; and r represents, independently in each occurrence, an integer of 1 to 4,

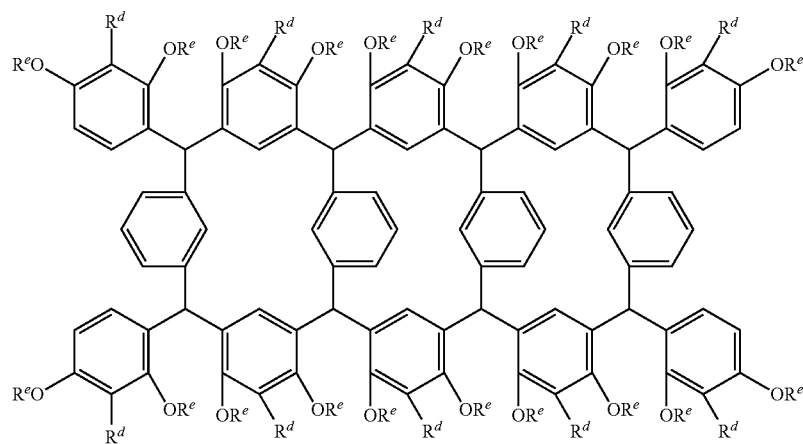

(IV)

wherein $R^d$ represents, identically or differently in each occurrence, alkyl; and $R^e$ is, identically or differently in each occurrence, selected from hydrogen and alkyl, where at least three occurrences of $R^e$ are hydrogen atoms,

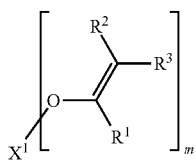

(1)

wherein $R^1$ is selected from hydrogen and $C_1$-$C_{16}$ alkyl; $R^2$ and $R^3$ are, identically or differently in each occurrence, selected from hydrogen, alkyl, and cycloalkyl, where at least two of $R^1$, $R^2$, and $R^3$ may be linked to each other to form a ring with adjacent one or two carbon atoms; $X^1$ represents an m-valent organic group; and m represents an integer of 2 or more, where occurrences of the group in the brackets with "m" may be identical to or different from each other.

11. A hyperbranched polymer derived from, via reaction, monomers comprising:
  a monomer (X) containing three or more hydroxy groups per molecule; and\
  a monomer (Y) containing two or more groups represented by General Formula (y) per molecule, General Formula (y) expressed as follows:

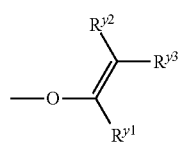
(y)

where $R^{y1}$ is selected from hydrogen and $C_1$-$C_{16}$ alkyl; and $R^{y2}$ and $R^{y3}$ are each, identically or differently, selected from hydrogen, alkyl, and cycloalkyl, where at least two of $R^{y1}$, $R^{y2}$, and $R^{y3}$ may be linked to each other to form a ring with adjacent one or two carbon atoms, the monomer (X) comprising compounds represented by General Formula (I);

the monomer (Y) comprising at least one compound selected from the group consisting of compounds represented by Formula (2t), compounds represented by Formula (2x), and compounds represented by Formula (2y):

General Formula (I), Formula (2t), Formula (2x), and Formula (2y), expressed as follows:

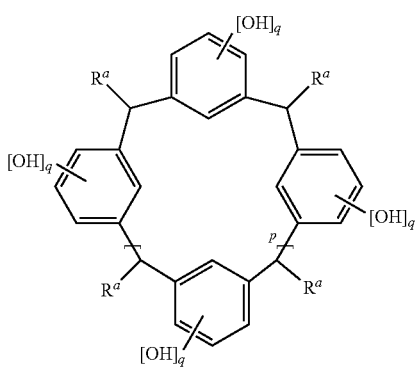
(I)

wherein p is selected from 1, 3, and 5; q represents, identically or differently in each occurrence, an integer of 1 to 3; and $R^a$ is, independently in each occurrence, selected from hydrogen, $C_1$-$C_4$ alkyl, and t-butylphenyl,

(2t)

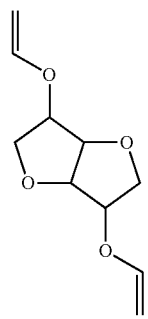
(2x)

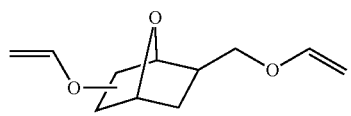
(2y)

and the hyperbranched polymer has a molecular-weight dispersity (Mw/Mn) of 1.10 to 2.

12. The hyperbranched polymer according to claim 11, which has a number-average molecular weight of 2,000 to 20,000.

13. The hyperbranched polymer according to claim 11, the monomer (X) comprising compounds represented by the following Formula:

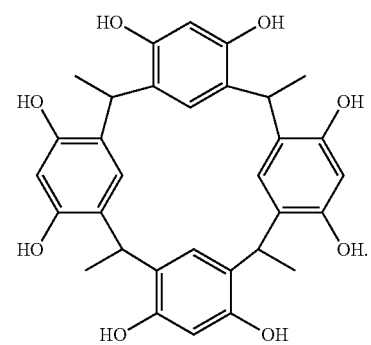 [SMILES: CC1c2cc(c(O)cc2O)C(C)c2cc(c(O)cc2O)C(C)c2cc(c(O)cc2O)C(C)c2cc1c(O)cc2O]

14. The hyperbranched polymer according to claim 11, wherein the monomers to constitute the hyperbranched polymer further comprise, in addition to the monomer (X) and monomer (Y),
  a compound represented by General Formula (3):

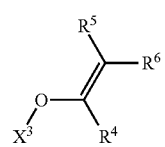
(3)

wherein $R^4$ is selected from hydrogen and $C_1$-$C_{16}$ alkyl; $R^5$ and $R^6$ are each, identically or differently, selected from hydrogen, alkyl, and cycloalkyl, where at least two of $R^4$, $R^5$, and $R^6$ may be linked to each other to form a ring with adjacent one or two carbon atoms; and $X^3$ represents a monovalent organic group devoid of groups represented by —O—$CR^4$=$CR^5R^6$.

15. A composition comprising:
the hyperbranched polymer according to claim 11;
a photoacid generator; and
an organic solvent.

16. A photoresist, comprising:
the composition according to claim 15.

17. A cured product of the composition according to claim 15.

18. A method for patterning, the method comprising:
applying the composition according to claim 15 to a base material or substrate;
curing the applied composition; and
subjecting the cured composition to development.

19. A method for producing a hyperbranched polymer, the method comprising the step of:
reacting monomers with each other, the monomers comprising:
a monomer (X) containing three or more hydroxy groups per molecule; and
a monomer (Y) containing two or more groups represented by General Formula (y) per molecule, General Formula (y) expressed as follows:

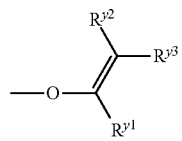

(y)

wherein $R^{y1}$ is selected from hydrogen and $C_1$-$C_{16}$ alkyl; and $R^{y2}$ and $R^{y3}$ are each, identically or differently, selected from hydrogen, alkyl, and cycloalkyl, where at least two of $R^{y1}$, $R^{y2}$, and $R^{y3}$ may be linked to each other to form a ring with adjacent one or two carbon atoms,
the monomer (X) comprising compounds represented by General Formula (I);
the monomer (Y) comprising at least one compound selected from the group consisting of compounds represented by Formula (2t), compounds represented by Formula (2x), and compounds represented by Formula (2y):
General Formula (I), Formula (2t), Formula (2x), and Formula (2y), expressed as follows:

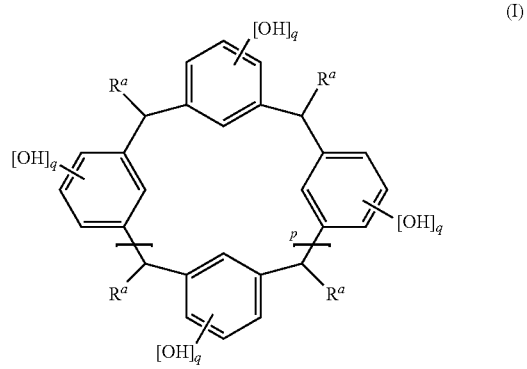

(I)

wherein p is selected from 1, 3, and 5; q represents, identically or differently in each occurrence, an integer of 1 to 3; and $R^a$ is, independently in each occurrence, selected from hydrogen, $C_1$-$C_4$ alkyl, and t-butylphenyl,

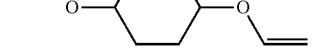

(2t)

(2x)

(2y)

and the hyperbranched polymer has a molecular-weight dispersity (Mw/Mn) of 1.10 to 2.

* * * * *